(12) United States Patent
Toriumi

(10) Patent No.: US 7,897,482 B2
(45) Date of Patent: Mar. 1, 2011

(54) SEMICONDUCTOR DEVICE AND MANUFACTURING METHOD THEREOF

(75) Inventor: Satoshi Toriumi, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 397 days.

(21) Appl. No.: 12/122,911

(22) Filed: May 19, 2008

(65) Prior Publication Data
US 2009/0114915 A1    May 7, 2009

(30) Foreign Application Priority Data
May 31, 2007 (JP) ............... 2007-144360

(51) Int. Cl.
H01L 21/30 (2006.01)
(52) U.S. Cl. .................... 438/458; 257/E21.6
(58) Field of Classification Search ........... 438/110, 438/149, 458, 464; 257/E21.6
See application file for complete search history.

(56) References Cited

U.S. PATENT DOCUMENTS

| 2,814,601 | A | 11/1957 | Currie et al. |
| 5,757,456 | A | 5/1998 | Yamazaki et al. |
| 5,821,138 | A | 10/1998 | Yamazaki et al. |
| 5,834,327 | A | 11/1998 | Yamazaki et al. |
| 6,218,499 | B1 | 4/2001 | Tarumi et al. |
| 6,875,674 | B2 | 4/2005 | Asami et al. |
| 6,984,476 | B2 * | 1/2006 | Kobayashi et al. ......... 430/7 |
| 7,351,300 | B2 | 4/2008 | Takayama et al. |
| 2003/0032210 | A1 | 2/2003 | Takayama et al. |
| 2004/0185673 | A1 | 9/2004 | Ichijo et al. |
| 2006/0270195 | A1 | 11/2006 | Yamada et al. |
| 2007/0004233 | A1 | 1/2007 | Morisue et al. |
| 2008/0102536 | A1 | 5/2008 | Toriumi |
| 2009/0042387 | A1 | 2/2009 | Yamada et al. |

FOREIGN PATENT DOCUMENTS

| JP | 2001-189460 | 7/2001 |
| JP | 2003-174153 | 6/2003 |

OTHER PUBLICATIONS

K. L. Yeo et al., "SIMS Backside Depth Profiling of Ultrashallow Implants Using Silicon-on-Insulator Substrates", *Surface and Interface Analysis*, 2002, pp. 373-375, vol. 33.

* cited by examiner

*Primary Examiner*—Quoc D Hoang
(74) *Attorney, Agent, or Firm*—Nixon Peabody LLP; Jeffrey L. Costellia

(57) ABSTRACT

A separation layer containing a halogen element is formed over a glass substrate by a plasma CVD method; a semiconductor element is formed over the separation layer; and separation is then performed inside the separation layer or at its interface, so that the large-area glass substrate and the semiconductor element are detached from each other. In order to perform detachment at the interface between the glass substrate and the separation layer, the separation layer may have concentration gradient of the halogen element, and the halogen element is contained more near the interface between the separation layer and the glass substrate than in the other areas.

26 Claims, 17 Drawing Sheets

FIG. 5A
FIG. 5C
FIG. 5B
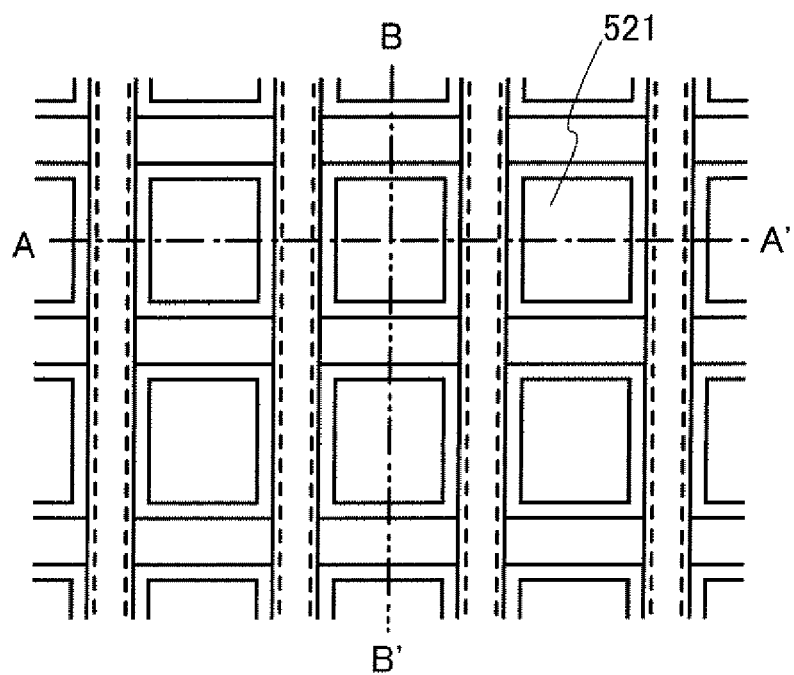
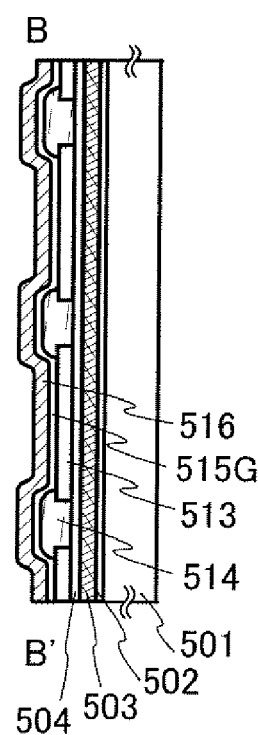
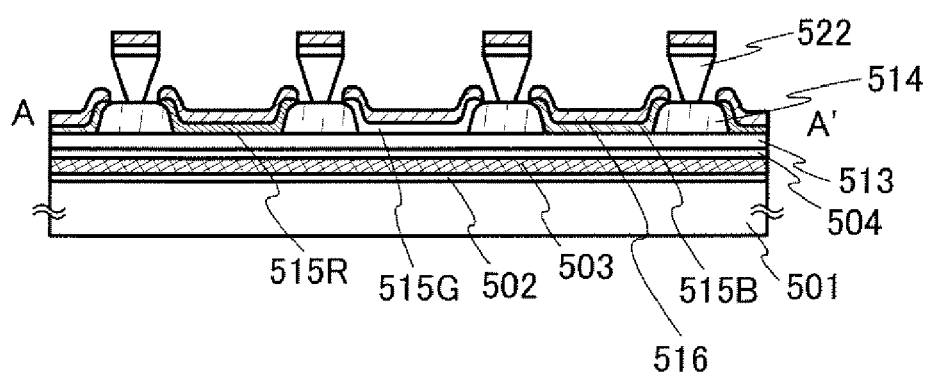

SEMICONDUCTOR DEVICE AND MANUFACTURING METHOD THEREOF

BACKGROUND OF THE INVENTION

1. Field of the Invention

The present invention relates to a semiconductor device having a circuit which includes a thin film transistor (hereinafter referred to as a TFT), and also relates to af manufacturing method thereof. For example, the present invention relates to an electronic appliance in which an electro-optic device typified by a liquid crystal display panel or a light-emitting display device including an organic light-emitting element is provided as a component.

It is to be noted that the semiconductor device in this specification refers to all devices that can function by utilizing semiconductor characteristics, and electro-optic devices, semiconductor circuits, and electronic appliances are all semiconductor devices.

2. Description of the Related Art

In recent years, a technique for manufacturing a thin film transistor (TFT) by using a semiconductor thin film (with a thickness of from about several to several hundred nanometers) formed over a substrate having an insulating surface has attracted attention. Thin film transistors are widely applied to electronic devices such as ICs and electro-optic devices, and urgent development is expected on thin film transistors as switching elements of image display devices in particular.

Among a variety of applications of such image display devices, which have been devised, application to portable appliances has particularly attracted attention. Glass substrates and quartz substrates are often used; however, they have disadvantages in that they are easily broken and they are heavy. Therefore, it has been tried to form TFT elements over a substrate which has flexibility, typically a plastic film which is flexible.

Consequently, a technique has been suggested in which an element formed over a glass substrate is separated from the substrate and transferred to another base material such as a plastic film.

The present applicant has suggested a separation and transfer technique in Patent Document 1. Patent Document 1 describes a technique in which a metal layer (Ti, Al, Ta, W, Mo, Cu, Cr, Nd, Fe, Ni, Co, Ru, Rh, Pd, Os, or Ir) is formed over a substrate and an oxide layer is stacked thereover. In this technique, when the oxide layer is formed, a metal oxide layer of the metal layer is formed at an interface between the metal layer and the oxide layer, and separation is carried out in a later step by utilizing this metal oxide layer.

Patent Document 1: Japanese Published Patent Application No. 2003-174153

SUMMARY OF THE INVENTION

The present invention discloses a technique in which an element manufactured through a relatively-low-temperature (lower than 600° C.) process, which is typified by a TFT formed using an amorphous silicon film or the like, a TFT formed using an organic semiconductor film, a light-emitting element, or a passive element (such as a sensor, an antenna, a resistor, or a capacitor), is detached (i.e., separated) from a glass substrate and disposed (i.e., transferred) to a flexible substrate (typically a plastic film).

A TFT formed using an amorphous silicon film or the like or a TFT formed using an organic semiconductor film can be directly formed over a plastic film; however, since plastic films are soft, it is necessary to prepare a manufacturing equipment exclusively for plastic films. When mass production is carried out, the manufacturing equipment supplies plastic films in accordance with a roll-to-roll method.

Furthermore, when a TFT is formed using an amorphous semiconductor film, an organic semiconductor film, or the like directly over a plastic film, there is a risk that the plastic film will be exposed to a solvent or etching gas that is used in a TFT manufacturing process, resulting in that the quality of the plastic film itself will change. In addition, when a TFT is formed using zinc oxide directly over a plastic film, if the plastic film is irradiated with plasma that is generated in a sputtering method or the like, the plastic film itself will become deformed. Moreover, there is another risk that moisture or the like will be absorbed into or released from the plastic film in the TFT manufacturing process, resulting in that an element will be contaminated. Additionally, because plastic films have lower heat resistance and higher degree of heat-induced expansion and contraction as compared to glass substrates, it is difficult to carefully control the process temperature of each step of the manufacturing process.

In the case of employing the separation method described in Patent Document 1, at least two layers need to be formed because an oxide layer is formed after a metal layer is formed over a glass substrate with the use of a sputtering apparatus. Moreover, when the metal layer contains an impurity, there is a risk that the impurity will diffuse into a semiconductor layer which is formed later.

In the case of using a sputtering apparatus for forming the metal layer, a member called a target is used. Although depending on the kind, the purity, and the size of metal, a target is expensive. In particular, a large-sized target corresponding to a large-area glass substrate is expensive. In addition, a target needs to be changed periodically. It is also an object of the present invention to reduce the manufacturing cost of a device which is formed by a separation method.

A separation layer containing a halogen element is formed over a large-area glass substrate by a plasma CVD method; a semiconductor element is formed over the separation layer; and then the large-area glass substrate and the semiconductor element are detached from each other by performing separation inside the separation layer or at an interface of the separation layer. It is to be noted that the upper limit of temperatures during the manufacturing process for the semiconductor element is lower than a temperature at which the halogen element in the separation layer is desorbed. As the halogen element, fluorine or chlorine can be used. Fluorine and chlorine are desorbed from the separation layer at temperatures of about 600° C. or higher A semiconductor layer formed by a plasma CVD method is used as the separation layer. As the semiconductor layer, typically, an amorphous silicon film, which is an amorphous semiconductor film, is used. In a case of forming a semiconductor layer containing a halogen element by using a plasma CVD method, the halogen element can be contained at a constant concentration without depending on a substrate temperature at the time of formation of the semiconductor layer. On the other hand, in a case of forming a semiconductor layer containing hydrogen by using a plasma CVD method, the concentration of hydrogen differs depending on a substrate temperature. Thus, with the halogen element which can be contained at a constant concentration, separation can be performed with high yield.

In order to perform detachment at the interface between the glass substrate and the separation layer, the separation layer may have concentration gradient of fluorine. The halogen element can be contained more near the interface between the glass substrate and the separation layer than in the other areas.

For example, the halogen element can be contained near the interface between the glass substrate and the separation layer when the amorphous silicon film is formed after a film-formation chamber of a plasma CVD apparatus has an atmosphere containing the halogen element. In this case, the concentration of the halogen element has its peak near the interface between the glass substrate and the separation layer, and the concentration of the halogen element decreases as the separation layer is formed. That is to say, it is not particularly necessary that the separation layer contain the halogen element at a uniform concentration. As long as the halogen element can be contained at least near the interface between the glass substrate and the separation layer, detachment can be performed in a later step with the interface functioning as a cleavage plane.

The concentration of the halogen element in the separation layer is equal to or higher than $1\times10^{17}$ cm$^{-3}$ and equal to or lower than $2\times10^{20}$ cm$^{-3}$. The separation is difficult to perform when the concentration of the halogen element is lower than $1\times10^{17}$ cm$^{-3}$. On the other hand, concentrations higher than $2\times10^{20}$ cM$^{-3}$ have a risk of causing peeling in a later step.

In addition to the halogen element, the separation layer may contain another element such as hydrogen, carbon, oxygen, or nitrogen. The concentration of each element is preferably in the range that peeling does not occur in a later step.

The separation layer has a thickness more than or equal to 10 nm and less than 500 nm. In the case where the amorphous silicon film is formed after the film-formation chamber of the plasma CVD apparatus has the atmosphere containing the halogen element, when the film thickness exceeds 100 nm, the amorphous silicon film may include a region containing the halogen element and a region excluding the halogen element (a region including the halogen element less than the lower limit of detection by secondary ion mass spectrometry (hereinafter referred to as SIMS)).

With the provision of a single layer of the semiconductor layer containing the halogen element over the glass substrate, the semiconductor element provided over the semiconductor layer can be detached from the glass substrate. The present invention can simplify the manufacturing process.

A first buffer layer may be provided between the semiconductor element and the separation layer in order to relieve the stress of the semiconductor layer containing the halogen element. An insulating layer such as a silicon oxide film or a silicon nitride film is used as the first buffer layer. In a case of forming the first buffer layer by a plasma CVD method, an amorphous silicon film containing fluorine and a silicon oxide film over the amorphous silicon film can be formed by the same plasma CVD apparatus without exposure to the air. When the same plasma CVD apparatus is used, impurity mixture and the like at the time of delivery between different film-formation apparatuses can be prevented.

By using a gas, such as nitrogen trifluoride, for cleaning the film-formation chamber, the film-formation chamber of the plasma CVD apparatus has the atmosphere containing the halogen element, so that cleaning of the film-formation chamber for maintenance and the formation of the separation layer can be performed in the same step. Therefore, time of cleaning separately can be saved. Moreover, the separation layer can be formed just after the cleaning.

In the case of performing detachment at an interface between the separation layer and the first buffer layer, the halogen element can be contained more near the interface between the separation layer and the first buffer layer than in the other areas. When the detachment is performed at the interface between the glass substrate and the separation layer, a step of removing the separation layer is performed in some cases. However, the step of removing the separation layer is not necessary when the detachment is performed at the interface between the separation layer and the first buffer layer.

An aspect of the present invention disclosed in this specification is a method of manufacturing a semiconductor device, which includes the following steps: forming a semiconductor layer containing a halogen element over a substrate having an insulating surface; forming a first buffer layer over the semiconductor layer; forming a semiconductor element or a light-emitting element over the first buffer layer; and performing detachment at an interface between the substrate and the semiconductor layer, inside the semiconductor layer, or at an interface between the semiconductor layer and the first buffer layer.

In the above structure, when the semiconductor layer is formed so that the concentration of the halogen element near the interface between the semiconductor layer and the substrate is higher than that near the interface between the semiconductor layer and the first buffer layer, the detachment can be performed at the interface between the substrate and the semiconductor layer. For example, when the semiconductor layer is formed after generating plasma by using nitrogen trifluoride, the concentration of the halogen element near the interface between the semiconductor layer and the substrate can be made higher than that near the semiconductor layer and the first buffer layer. Alternatively, the concentration of the halogen element near the interface between the semiconductor layer and the substrate may be made higher than that near the interface between the semiconductor layer and the first buffer layer by doping with the halogen element after the formation of the semiconductor layer, in accordance with an ion implantation method or an ion doping method.

The detachment is possible at the interface between the semiconductor layer and the first buffer layer when the semiconductor layer is formed so that the concentration of the halogen element near the interface between the semiconductor layer and the first buffer layer is higher than that near the interface between the semiconductor layer and the substrate. For example, when fluorine plasma treatment is performed after the formation of the semiconductor layer, the concentration of the halogen element near the interface between the semiconductor layer and the first buffer layer can be made higher than that near the interface between the semiconductor layer and the substrate. Alternatively, the concentration of the halogen element near the interface between the semiconductor layer and the first buffer layer may be made higher than that near the interface between the semiconductor layer and the substrate by doping with the halogen element after the formation of the semiconductor layer, in accordance with an ion implantation method or an ion doping method.

The present invention achieves at least one of the above objects.

Moreover, a second buffer layer may be provided between the glass substrate and the separation layer. A silicon oxide film is used as the second buffer layer. The use of a silicon nitride film as the second buffer layer causes peeling. However, even when a silicon oxide film is used, peeling occurs if the composition ratio of the silicon oxide film is Si=32%, O=27%, N=24%, and H=17%. A silicon oxide film with a composition ratio of Si=32%, O=59%, N=7%, and H=2% can be used as the second buffer layer. A silicon oxide film containing nitrogen in its composition ratio is also called a silicon oxynitride film; however, in this specification, even if nitrogen is contained in the composition ratio, a silicon oxide film containing more oxygen than nitrogen is called a silicon oxide film. Moreover, in this specification, even if oxygen is contained in the composition ratio, a silicon nitride film containing more nitrogen than oxygen is called a silicon nitride film.

This silicon oxide film (composition ratio: Si=32%, O=59%, N=7%, and H=2%) was formed in 100 nm thick over a glass substrate, plasma was generated by introducing nitrogen trifluoride into a chamber, and an amorphous silicon film was formed in 0.5 μm thick with fluorine remaining in the chamber. Just after the formation of the amorphous silicon film, separation was performed by attaching a kapton tape. From this tape separation experiment, separation of the amorphous silicon film has been confirmed as shown in FIG. 17A. That is to say, separation is possible without heat treatment. FIG. 17A is a photograph which shows a separation area 1702 where separation has been performed by attaching a tape 1703 so that a part of the amorphous silicon film formed over the substrate 1701 is separated. FIG. 17B is a pattern diagram thereof.

FIG. 15 shows SIMS measurement results of the sample before the separation in the aforementioned tape separation experiment. FIG. 16 shows SIMS measurement results of the sample after the separation.

According to the present invention, after elements such as TFTs are formed by using an existing manufacturing equipment for large-area glass substrates, the elements can be transferred to a flexible substrate typified by a plastic substrate. Therefore, the facility cost can be reduced drastically.

After the semiconductor element is detached from the glass substrate, the separation layer may be removed. Alternatively, the separation layer may remain so that the semiconductor layer containing fluorine can function as a blocking layer.

Another aspect of the present invention is a semiconductor device which includes a semiconductor layer containing a halogen element over a plastic substrate; and a semiconductor element or a light-emitting element over the semiconductor layer containing the halogen element, where the concentration of the halogen element in the semiconductor layer is equal to or higher than $1 \times 10^{17}$ cm$^{-3}$ and equal to or lower than $2 \times 10^{19}$ cm$^{-3}$.

In the above structure, the halogen element is fluorine or chlorine. With the above structure, the semiconductor layer containing fluorine or chlorine can prevent impurity intrusion from outside even after the plastic substrate and the semiconductor element are attached to each other after the separation. Since a glass substrate contains alkali metal, in a case of using a TFT as the semiconductor element, there is a risk that alkali metal diffusing from the glass substrate degrades operating characteristics or reliability of the TFT. Accordingly, the semiconductor layer containing fluorine or chlorine is effective in that the semiconductor layer can function as a blocking layer for blocking diffusion of alkali metal to the semiconductor element in steps before the separation.

Moreover, in the above structure, an adhesive layer is provided between the plastic substrate and the semiconductor layer containing the halogen element.

Further, a buffer layer may be provided between the semiconductor element or the light-emitting element, and the semiconductor layer containing the halogen element.

The present invention can be used regardless of an element structure of the semiconductor element, such as a TFT structure. For example, a top-gate TFT, a bottom-gate (inverted-staggered) TFT, or a staggered TFT can be used. The TFT is not limited to a single-gate transistor, and may be a multi-gate transistor having a plurality of channel formation regions, such as a double-gate transistor.

According to the present invention, a large-sized display device using a flexible substrate can be manufactured. In addition, a passive matrix liquid crystal display device and a passive matrix light-emitting device, and moreover an active matrix liquid crystal display device and an active matrix light-emitting device can be manufactured.

Additionally, the flexible substrate refers to a plastic substrate that is formed as a film, for example, a plastic substrate made from polyethylene terephthalate (PET), polyethersulfone (PES), polyethylene naphthalate (PEN), polycarbonate (PC), nylon, polyetheretherketone (PEEK), polysulfone (PSF), polyetherimide (PEI), polyarylate (PAR), polybutylene terephthalate (PBT), or the like.

Even when the substrate has a large area, the separation layer with reduced manufacturing cost can be provided by forming the amorphous silicon film containing fluorine with the use of a parallel plate plasma CVD apparatus (hereinafter referred to as a PCVD apparatus).

BRIEF DESCRIPTION OF THE DRAWINGS

FIG. 5A is a top view and FIGS. 5B and 5C are cross-sectional views, each showing a passive matrix light-emitting device (Embodiment Mode 3).

DETAILED DESCRIPTION OF THE INVENTION

Hereinafter, embodiment modes and embodiments of the present invention will be described with reference to the drawings. However, the present invention can be implemented in many different modes, and it is easily understood by those skilled in the art that various changes and modifications can be made without any departure from the spirit and scope of the present invention. Accordingly, the present invention is not construed as being limited to the described content of the embodiment modes and embodiments included herein.

Embodiment Mode 1

An example of manufacturing a liquid crystal display device will be explained here with reference to FIGS. 1A to 1E and FIG. 4.

First, an amorphous silicon film 102 containing fluorine is formed over a substrate 101. A glass substrate is used as the substrate 101. The amorphous silicon film 102 containing fluorine is formed by a PCVD method to a thickness greater than or equal to 10 nm and less than 500 nm. The amorphous silicon film 102 containing fluorine may be formed by using a material gas containing fluorine ($CF_4$, $CHF_3$, $C_2F_6$, or $SF_6$). Here, the amorphous silicon film 102 is formed in such a way that a capacitively-coupled plasma CVD apparatus is used and etching is performed inside a process chamber with the use of a fluorine-based gas (for example, flow rate of nitrogen trifluoride: 100 SCCM, flow rate of argon: 50 SCCM, RF output: 300 W at 27 MHz, pressure in the process chamber: 13 Pa, and substrate temperature: 250° C.), i.e., chamber cleaning is performed, and then the amorphous silicon film 102 is deposited by an autodoping method utilizing fluorine remaining in the process chamber. Here, the amorphous silicon film 102 containing fluorine is formed under the condition where the flow rate of monosilane gas is 100 SCCM, the RF output is 20 W at 27 MHz, the pressure in the process chamber is 33 Pa, the substrate temperature is 250° C., and the film thickness is about 50 nm.

Instead of fluorine, another halogen element may be used. For example, $Cl_2$, $CCl_4$, $BCl_3$, $ClF_3$, or the like may be used as the material gas.

Figure 4:
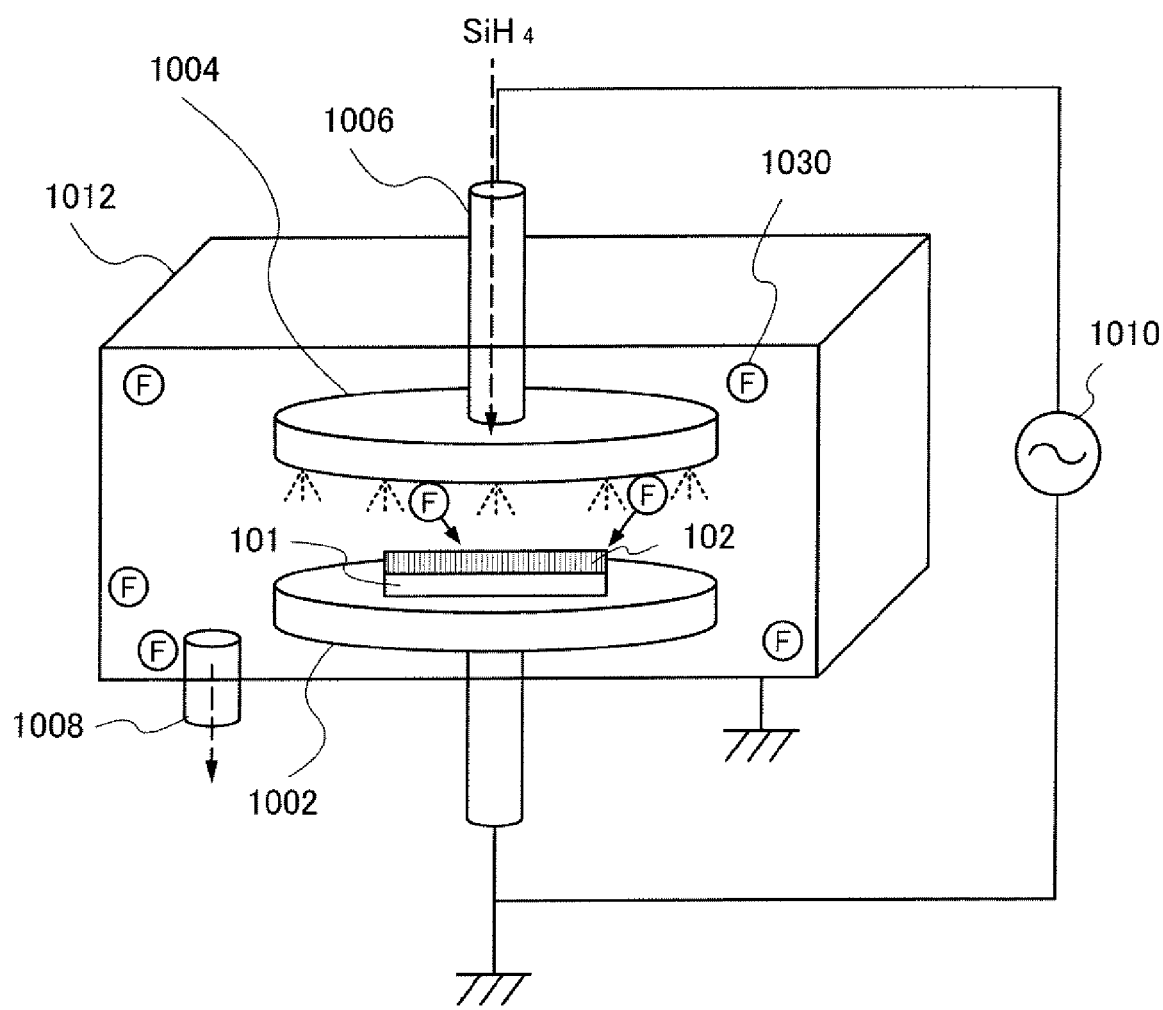
FIG. 4 is a schematic view of a capacitively-coupled plasma CVD apparatus.

FIG. 14 is a schematic view of a capacitively-coupled plasma CVD apparatus. A capacitively-coupled plasma CVD apparatus 1000 shown in FIG. 4 is provided with a process chamber 1012 including a substrate electrode plate 1002, a high-frequency electrode plate 1004, a gas introducing portion 1006, and an exhaust port 1008. The substrate electrode plate 1002 and the high-frequency electrode plate 1004 are disposed in parallel to each other. The substrate electrode plate 1002 is at a ground potential, whereas the high-frequency electrode plate 1004 is at a potential different from the ground potential. An object to be processed (corresponding to the substrate 101 in FIG. 4) is held by the substrate electrode plate 1002. The electric discharge of the capacitively-coupled plasma CVD apparatus 1000 is carried out by an AC power source 1010, so that plasma is generated between the substrate electrode plate 1002 and the high-frequency electrode plate 1004.

The amorphous silicon film 102 containing fluorine thus obtained contains fluorine at a concentration equal to or higher than $1\times10^{17}$ $cm^3$ and equal to or lower than $2\times10^{20}$ $cm^3$, hydrogen at a concentration equal to or higher than $1\times10^{21}$ $cm^{-3}$ and equal to or lower than $1\times10^{22}$ $cm^{-3}$, carbon at a concentration equal to or higher than $1\times10^{15}$ $cm^{-3}$ and equal to or lower than $2\times10^{18}$ $cm^{-3}$, nitrogen at a concentration equal to or higher than $1\times10^{18}$ $cm^{-3}$ and equal to or lower than $1\times10^{20}$ $cm^{-3}$ and oxygen at a concentration equal to or higher than $1\times10^{15}$ $cm^{-3}$ and equal to or lower than $1\times10^{19}$ $cm^{-3}$.

Although the amorphous silicon film 102 containing fluorine is formed over the glass substrate in this example, a buffer layer may be formed between the glass substrate and the amorphous silicon film 102 containing fluorine. A silicon oxide film may be used as the buffer layer.

The amorphous silicon film 102 containing fluorine which is formed near the periphery of the substrate may be removed as selected so that separation will not occur from an edge of the substrate in a later step of delivery or the like. In this case, separation will not occur in a later separation step at the periphery of the substrate where the amorphous silicon film containing fluorine, which will serve as a separation layer, has been removed as selected. Therefore, a trigger of separation is preferably formed by laser light or a cutter, so that separation is performed from a place where the trigger is formed.

Next, a first insulating film 103 serving as an etching stopper film is formed over the amorphous silicon film 102 containing fluorine. In order to remove the amorphous silicon film 102 containing fluorine in a later step, an insulating film such as a silicon oxide film or a silicon nitride film is used as the first insulating film 103. As the first insulating film 103, a film obtained by applying and baking a solution containing polysilazane or siloxane polymer, a photocurable organic resin film, a thermosetting organic resin film, or the like may be used.

Subsequently, a first conductive film is formed over the first insulating film 103, and then a mask is formed over the first conductive film. The first conductive film is formed of an element selected from Ta, W, Ti, Al, Cu, Cr, Nd, or the like or an alloy or compound material containing any of these elements as its main component, as a single layer or stacked layers. The first conductive film is formed by a sputtering method, an evaporation method, a CVD method, a coating method, or the like, as appropriate. Next, the first conductive film is etched by using the mask, thereby forming a gate electrode 104.

Subsequently, a second insulating film 105 serving as a gate insulating film is formed over the gate electrode 104. As the second insulating film 105, an insulating film such as a silicon oxide film, a silicon nitride film, or a silicon oxynitride film is used. Alternatively, a film obtained by applying and baking a solution containing polysilazane or siloxane polymer, a photocurable organic resin film, a thermosetting organic resin film, or the like may be used as the second insulating film 105.

Next, a semiconductor film 106 with an amorphous structure is formed over the second insulating film 105. The semiconductor film 106 with an amorphous structure is formed using a microcrystalline semiconductor film or an amorphous semiconductor film manufactured by a thermal CVD method, a sputtering method, or a vapor deposition method by using a semiconductor material gas typified by silane or germane. This embodiment mode shows an example in which an amorphous silicon film is used as the semiconductor film. As the semiconductor film, alternatively, zinc oxide or an oxide of zinc-gallium-indium which is manufactured by a sputtering method or a PLD (pulse laser deposition) method may be used. In this case, a gate insulating film is preferably formed of an oxide including aluminum or titanium.

Figure 1A:
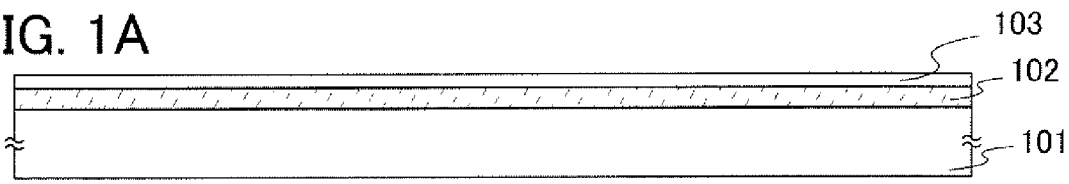
FIGS. 1A to 1E are cross-sectional views showing manufacturing steps of a liquid crystal display device (Embodiment Mode 1).
Figure 1B:
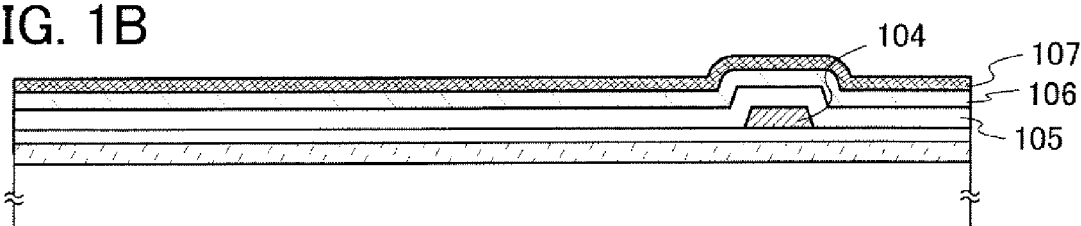

Subsequently, as a semiconductor film containing an impurity element imparting one conductivity, an amorphous semiconductor film 107 containing an impurity element imparting n-type conductivity is formed to a thickness of from 20 to 80 nm. The amorphous semiconductor film 107 containing an impurity element imparting n-type conductivity is formed over the entire surface by a known method such as a plasma CVD method or a sputtering method. A cross-sectional process diagram of what is obtained after processes up to this stage have been completed is shown in FIG. 1B.

Next, patterning is performed in accordance with a known photolithography technique, thereby forming an island-shaped semiconductor layer and a semiconductor layer having conductivity. Instead of a known photolithography technique, a mask may be formed by a droplet discharging method or a printing method (such as relief printing, planography, intaglio printing, or screen printing) and etching may be performed as selected.

Next, a composition including a conductive material (such as silver, gold, copper, tungsten, or aluminum) is discharged as selected by a droplet discharging method, thereby forming a source electrode 112 and a drain electrode 113. Instead of a droplet discharging method, the source electrode 112 and the drain electrode 113 may be formed in such a way that a metal film (Ta, W, Ti, Al, Cu, Cr, Nd, or the like) is formed by a sputtering method, and the metal film is patterned by a known photolithography technique.

Next, semiconductor layers 110 and 111 having conductivity are formed by using the source electrode 112 and the drain electrode 113 as masks. The semiconductor layers 110 and 111 are etched using the source electrode 112 and the drain electrode 113 as masks so as to partially expose the semiconductor film 106, and moreover, an upper part of the semiconductor film 106 is removed to form a semiconductor layer 109. The exposed part of the semiconductor layer 109 functions as a channel formation region of a TFT.

Subsequently, a protection film 114 is formed to prevent the channel formation region of the semiconductor layer 109 from impurity contamination. The protection film 114 is formed of a material containing silicon nitride or silicon nitride oxide as a main component, by a sputtering method or a PCVD method. In this embodiment mode, hydrogenation treatment is performed after the protection film is formed. Thus, a TFT 108 is manufactured.

Next, an interlayer insulating film 115 is formed over the protection film 114. The interlayer insulating film 115 is formed of a resin material such as an epoxy resin, an acrylic resin, a phenolic resin, a novolac resin, a melamine resin, or a urethane resin. An organic material such as benzocyclobutene, parylene, or polyimide which has a light-transmitting property; a compound material formed by polymerization, such as a siloxane-based polymer; a composition material containing a water-soluble homopolymer and a water-soluble copolymer; or the like can also be used. Alternatively, an insulating film such as a silicon oxide film, a silicon nitride film, or a silicon oxynitride film can be used as the interlayer insulating film 115, and the insulating film and the resin material may be stacked.

Next, patterning is performed in accordance with a known photolithography technique to remove the protection film 114 and the interlayer insulating film 115 as selected, thereby forming a contact hole that reaches the drain electrode 113.

Then, a composition including a conductive material (such as silver, gold, copper, tungsten, or aluminum) is discharged as selected by a droplet discharging method, thereby forming first electrodes 116 which are electrically connected to the drain electrode 113. In addition, second electrodes 117 are formed by a droplet discharging method in order that an electric field in a direction parallel to the substrate surface can be formed between the first electrode 116 and the second electrode 117. It is to be noted that the first electrodes 116 and the second electrodes 117 are preferably disposed at an equal distance from each other, and a top surface of the electrodes may have a comb-like shape.

Figure 1C:
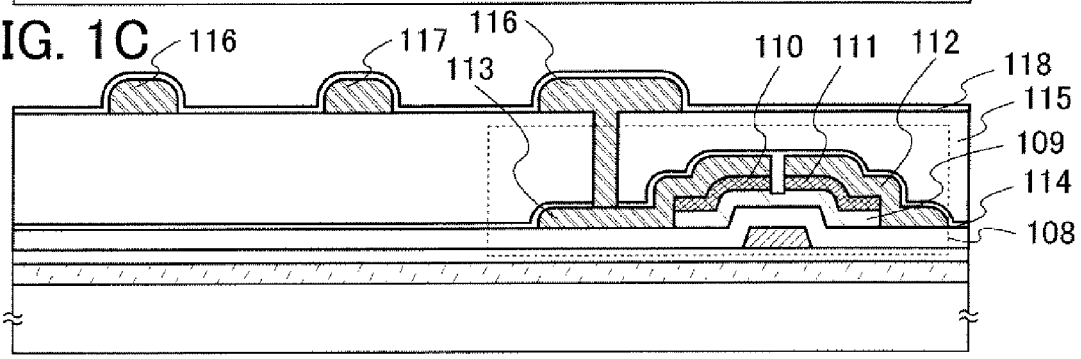

Next, an orientation film 118 is formed so as to cover the first electrodes 116 and the second electrodes 117. A cross-sectional process diagram of what is obtained after processes up to this stage have been completed is shown in FIG. 1C.

Then, a liquid crystal material, here polymer-dispersed liquid crystals, is used to fix a flexible substrate 121 so as to be opposite to the substrate 101. Polymer-dispersed liquid crystals are divided into two types depending on the dispersion state of the liquid crystals and polymer materials. One of these two types is that in which droplets of liquid crystals are dispersed in a polymer material and the liquid crystals are discontinuous (called PDLC). The other is that in which a polymer material forms a network in liquid crystals and the liquid crystals are continuous (called PNLC). Note that although either type may be used in this embodiment mode, PDLC is used here. In this embodiment mode, a polymer material 119 including liquid crystals 120 fixes the flexible substrate 121. If necessary, a sealant may be provided so as to surround the polymer material 119. Further, if necessary, a spacer (such as a bead spacer, a column spacer, or fiber) may be used to control the thickness of the polymer material 119.

Figure 1D:
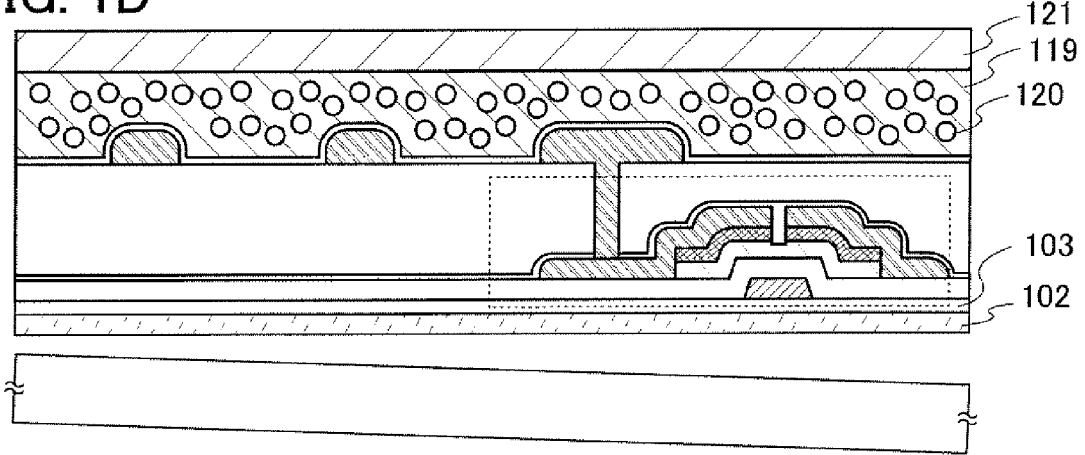

Next, the TFT 108 and the flexible substrate 121 are separated from the substrate 101. Although detachment is performed at an interface between the substrate 101 and the amorphous silicon film 102 containing fluorine, as shown in FIG. 1D, a place at which the detachment is performed is not limited in particular as long as the TFT is not broken. The detachment may be performed inside the amorphous silicon film 102 containing fluorine, or at an interface between the first insulating film 103 and the amorphous silicon film 102 containing fluorine.

Next, the amorphous silicon film 102 containing fluorine is removed. Dry etching or wet etching is performed by using the first insulating film 103 as an etching stopper. Since this embodiment mode explains an example of manufacturing a transmissive liquid crystal display device, the amorphous silicon film 102 containing fluorine which decreases light transmittance is removed; however, in a case of manufacturing a reflective liquid crystal display device, the amorphous silicon film 102 containing fluorine may remain in the reflective liquid crystal display device.

Moreover, although this embodiment mode shows the example in which much fluorine is contained near the interface between the substrate and the amorphous silicon film containing fluorine, detachment can be performed at the interface between the first insulating film 103 and the amorphous silicon film containing fluorine when much fluorine is contained near the interface between the first insulating film 103 and the amorphous silicon film containing fluorine. In the latter case, a step of removing the amorphous silicon film containing fluorine is unnecessary.

Figure 1E:
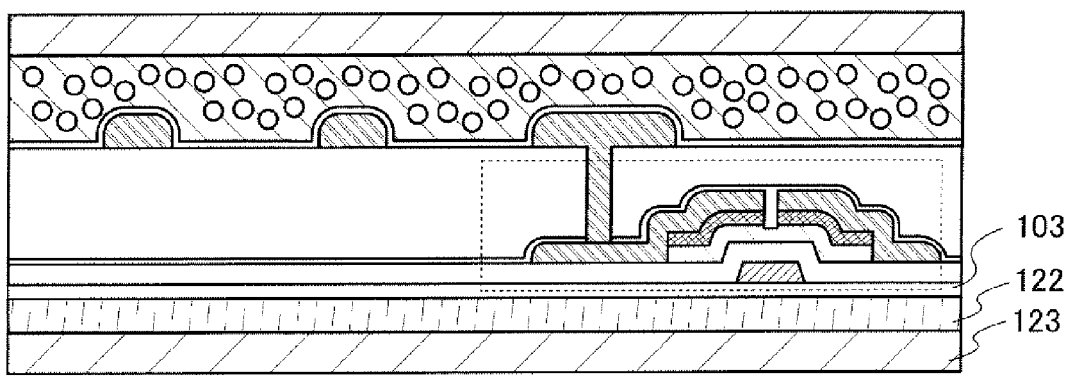

Next, a flexible substrate 123 is fixed to a surface of the first insulating film 103 by using an adhesive layer 122, in order to increase mechanical strength of the liquid crystal display device, as shown in FIG. 1E. In order to keep the space between the substrates without depending on change in temperature, the flexible substrate 121 and the flexible substrate 123 are preferably formed of materials with the same coefficient of thermal expansion. When the liquid crystal display device has enough mechanical strength, the flexible substrate 123 is not particularly necessary.

In accordance with the above steps, an active matrix liquid crystal display device using an amorphous silicon TFT can be manufactured. The conductive layer formed by a droplet discharging method has low adhesion; however, when the separation method of the present invention which uses the amorphous silicon film 102 containing fluorine is employed, separation is possible even though a part of wiring is formed using a conductive layer formed by a droplet discharging method.

An electrophoretic display may be manufactured by using electronic ink instead of polymer-dispersed liquid crystals. In this case, after the first electrodes 116 and the second electrodes 117 are formed, electronic ink may be applied by a printing method and then baked, and may subsequently be fixed by the flexible substrate 121. Then, after separating the substrate, another flexible substrate may be used for sealing.

Embodiment Mode 2

Here, an example of manufacturing an active matrix light-emitting device using an organic TFT will be explained with reference to FIGS. 2A to 2D.

First, a first silicon oxide film 202 (composition ratio: Si=32%, O=59%, N=7%, H=2%) is formed in 115 nm thick over a substrate 201 by a plasma CVD method with the use of $SiH_4$ and $N_2O$ as a material gas.

Next, plasma is generated by using nitrogen trifluoride. Then, an amorphous silicon film is formed by a plasma CVD method with the use of the film-formation chamber with fluorine remaining therein. Thus, an amorphous silicon film 203 having a concentration peak of fluorine near the first silicon oxide film 202 is obtained.

Figure 2A:
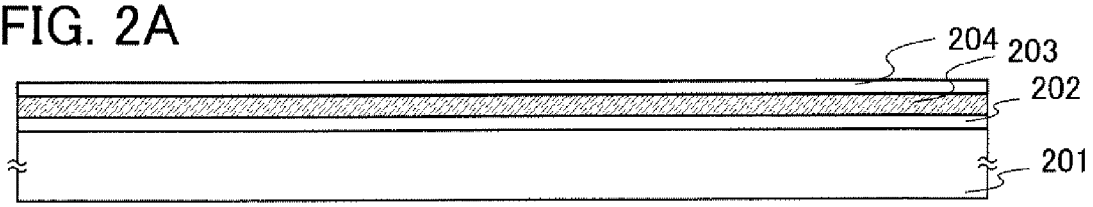
FIGS. 2A to 2D are cross-sectional views showing manufacturing steps of a light-emitting device (Embodiment Mode 2).

Subsequently, a second silicon oxide film 204 is formed over the amorphous silicon film 203 to a thickness of from 10 to 200 nm (preferably 50 to 100 nm) by a plasma CVD method with the use of $SiH_4$, $NH_3$, and $N_2O$ as a material gas. Here, the second silicon oxide film 204 (composition ratio: Si=32%, O=27%, N=24%, H=17%) is formed to a thickness of 50 nm. A cross-sectional process diagram of what is obtained after processes up to this stage have been completed is shown in FIG. 2A.

Next, a conductive layer serving as a gate electrode is formed over the second silicon oxide film 204. The conductive layer may be formed of any material as long as it is a metal which comes to have an insulating property by nitridation and/or oxidation. The material is preferably tantalum, niobium, aluminum, copper, or titanium in particular. As an alternative to those metals, tungsten, chromium, nickel, cobalt, magnesium, or the like is given. A method of forming the conductive layer is not particularly limited, and the conductive layer may be formed by a sputtering method, an evaporation method, or the like and may subsequently be processed into a desired shape by a method of etching or the like. Alternatively, the conductive layer may be formed by an inkjet method or the like with the use of droplets that contain a conductor.

Next, a gate insulating film 212 including a nitride, an oxide, or an oxynitride of the aforementioned metal is formed by nitriding and/or oxidizing the conductive layer. It is to be noted that a part of the conductive layer other than the gate insulating film 212, which has been insulated, functions as a gate electrode 211.

Subsequently, a semiconductor layer 213 covering the gate insulating film 212 is formed. For an organic semiconductor material used to form the semiconductor layer 213, either a low-molecular material or a macromolecular material can be used, as long as it is an organic material which has carrier transportability and which can change in carrier density by an electric field effect. There is no particular limitation on the type of material used, and polycyclic aromatic compounds, conjugated double bond compounds, metal phthalocyanine complexes, charge-transfer complexes, condensed ring tetracarboxylic acid diimides, oligothiophenes, fullerenes, carbon nanotubes, and the like can be given. For example, polypyrrole, polythiophene, poly(3-alkylthiophene), polyphenylenevinylene, poly(p-phenylenevinylene), polyaniline, polydiacetylene, polyazulene, polypyrene, polycarbazole, polyselenophene, polyfuran, poly(p-phenylene), polyindole, polypyridazine, naphthacene, hexacene, heptacene, pyrene, chrysene, perylene, coronene, terrylene, ovalene, quaterrylene, circumanthracene, triphenodioxazine, triphenodithiazine, hexacene-6,15-quinone, polyvinyl carbazole, polyphenylene sulfide, polyvinylene sulfide, polyvinylpyridine, naphthalene tetracarboxylic acid diimide, anthracene tetracarboxylic acid diimide, C60, C70, C76, C78, and C84 and derivatives of any of these can be used. Furthermore, as specific examples of these materials, tetracene, pentacene, sexithiophene (6T), copper phthalocyanine, bis(1,2,5-thiadiazolo)-p-quinobis(1,3-dithiole), rubrene, poly(2,5-thienylene vinylene) (PTV), poly(3-hexylthiophene-2,5-diyl) (P3HT), and poly(9,9'-dioctyl-fluorene-co-bithiophene) (FST2), which are generally considered to be p-type semiconductors; and 7,7,8,8-tetracyanoquinodimethane (TCNQ), 3,4,9,10-perylenetetracarboxylic dianhydride (PTCDA), 1,4,5,8-naphthalenetetracarboxylic dianhydride (NTCDA), N,N'-dioctyl-3,4,9,10-perylenetetracarboxylic diimide (PTCDI-C8H), copper hexadecafluorophthalocyanine ($F_{16}$CuPc); N,N'-bis(2,2,3,3,4,4,5,5,6,6,7,7,8,8,8-pentadecafluorooctyl)-1,4,5,8-naphthalenetetracar boxylic diimide (NTCDI-C8F), 3',4'-dibutyl-5,5"-bis(dicyanomethylene)-5,5"-dihydro-2,2':5',2"-terthiophene) (DCMI, and methanofullerene[6,6]-phenyl-$C_{61}$ butyric acid methyl ester (PCBM), which are generally considered to be n-type semiconductors; and the like can be given. It is to be noted that the attributes of p-type and n-type of organic semiconductors are not inherent to the semiconductors. Although semiconductor materials have a tendency to become p-type or n-type depending on the relationship between the material and an electrode from which carriers are injected or on the strength of the electric field when carriers are injected, the semiconductor materials can be used as either p-type or n-type. It is to be noted that, in the present embodiment mode, using p-type semiconductors is more preferable.

These organic semiconductor materials can be used to form films by an evaporation method, a spin coating method, a droplet discharging method, or the like.

Next, buffer layers 214 are formed over the semiconductor layer 213 in order to improve adhesiveness and chemical stability of an interface. For the buffer layers 214, an organic material that has conductivity (an organic compound that exhibits electron acceptability, for example, 7,7,8,8-tetracyanoquinodimethane (TCNQ); 2,3,5,6-tetrafluoro-7,7,8,8-tetracyanoquinodimethane ($F_4$-TCNQ); or the like) or a composite material of an organic compound and a metal oxide may be used. It is to be noted that the buffer layers 214 may be omitted if unnecessary.

Next, conductive layers 215 serving as a source electrode and a drain electrode are formed over the buffer layers 214. There is no particular limitation on a material used for the conductive layers 215; however, a metal such as gold, platinum, aluminum, tungsten, titanium, copper, tantalum, niobium, chromium, nickel, cobalt, or magnesium, or an alloy that contains any of these metals can be used. Alternatively, for other materials that can be used for the conductive layers 215, a conductive macromolecular compound such as polyaniline, polypyrrole, polythiophene, polyacetylene, polydiacetylene, and the like can be given. It is to be noted that there is no limitation on the formation method of the conductive layers 215 as long as it is a method by which the semiconductor layer 213 is not degraded, and the conductive layers 215 may be manufactured by being processed into a desired shape by a method of etching or the like after film formation by a sputtering method, an evaporation method, or the like. Furthermore, the conductive layers 215 may be formed by an inkjet method or the like using droplets that contain a conductor. Through the above process, an organic transistor 227 can be manufactured.

In addition, an organic insulating material of polyimide, polyamic acid, polyvinyl phenyl, or the like may be formed in contact with a lower surface of the semiconductor layer 213. By this kind of structure, orientation of the organic semiconductor material can be improved further, and the adhesiveness between the gate insulating film 212 and the semiconductor layer 213 can be improved further.

Next, a method of manufacturing a light-emitting device that uses the organic transistor 227 will be described.

Next, an interlayer insulating film 228 is formed to cover the organic transistor 227. Then, the interlayer insulating film 228 is etched as selected, thereby forming a contact hole that reaches one of the conductive layers 215. Next, a first electrode 210 that is electrically connected to the one of the conductive layers 215 is formed. Subsequently, a partition wall 221 is formed to cover edges of the first electrode 210. The partition wall 221 is formed of an insulating material and fulfills a function of insulating between a plurality of the first electrodes 210 that is arranged adjacent to each other.

Next, a light-emitting layer 222 is formed over a region of the first electrode 210 that does not come into contact with the partition wall 221. The light-emitting layer 222 is formed of, in many cases, a single layer or stacked layers of an organic compound or a single layer or stacked layers of an inorganic compound. This specification also includes a structure in which an inorganic compound is used in a part of a film formed of an organic compound. For each of the layers in a light-emitting element, there is no limitation on a method of stacking layers. As long as layers can be stacked, any kind of technique including a vacuum vapor deposition method, a spin coating method, an inkjet method, a dip coating method, or the like may be selected.

Next, a second electrode 223 is formed over the light-emitting layer 222. A light-emitting element is formed at a place where the first electrode 210, the second electrode 223, and the light-emitting layer 222 overlap with each other. It is to be noted that this light-emitting element has an anode, a cathode, and a layer that contains an organic compound or a layer that contains an inorganic compound, with which luminescence (electroluminescence) generated by application of an electric field is obtained (this type of layer will hereinafter be referred to as an EL layer). In particular, an inorganic EL element using an inorganic thin film of ZnS:Mn and an organic EL element using an organic evaporation thin film are bright, exhibit highly efficient EL light emission, and are suitable for application in a display. It is to be noted that there is no particular limitation on the structure of the light-emitting element.

In this embodiment mode, the first electrode 210 is formed of a metal material that reflects light, such as aluminum, silver, or an alloy including any of them, and the second electrode 223 is formed using a transparent conductive film.

Next, a protection film 224 is formed over the second electrode 223. The protection film 224 is an insulating film having a light-transmitting property. It is to be noted that the protection film 224 may be omitted if unnecessary.

Figure 2B:
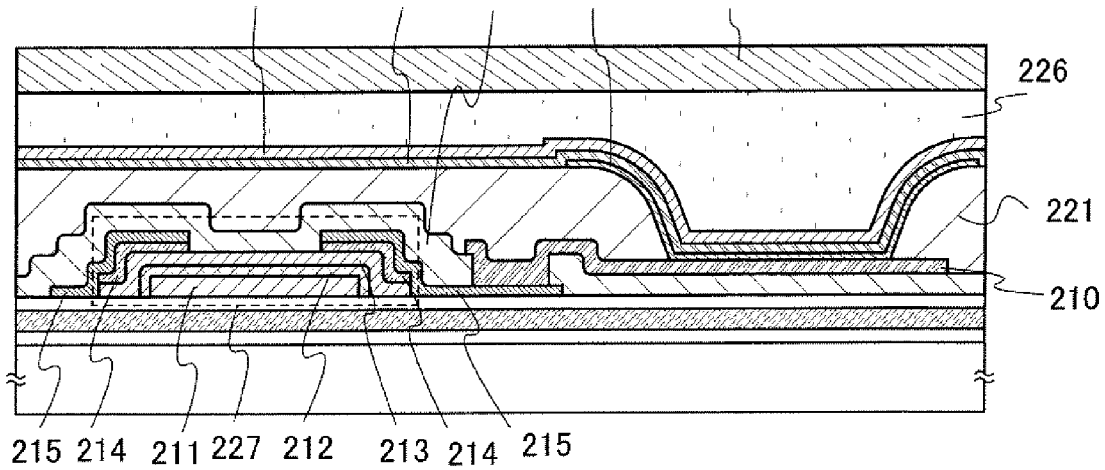

Next, a flexible substrate 225 is fixed over the protection film 224 with an adhesive layer 226 interposed therebetween. A sealant may be placed so as to surround the adhesive layer 226 in order to strengthen sealing. A cross-sectional process diagram of what is obtained after processes up to this stage have been completed is shown in FIG. 2B.

Figure 2C:
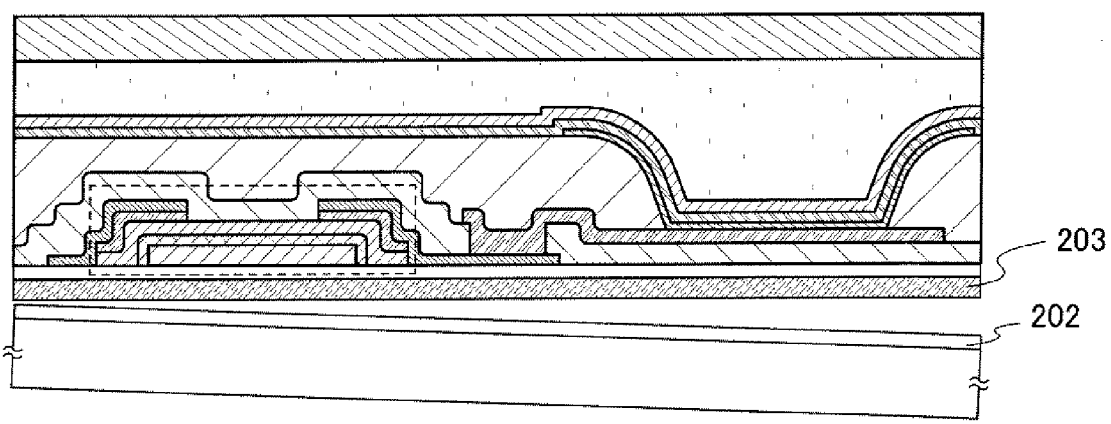

Subsequently, detachment is performed at an interface between the first silicon oxide film 202 and the amorphous silicon film 203 or inside the amorphous silicon film 203, so that the organic transistor 227 and the flexible substrate 225 are separated from the substrate 201. FIG. 2C shows that the detachment is performed at the interface between the first silicon oxide film 202 and the amorphous silicon film 203.

Figure 2D:
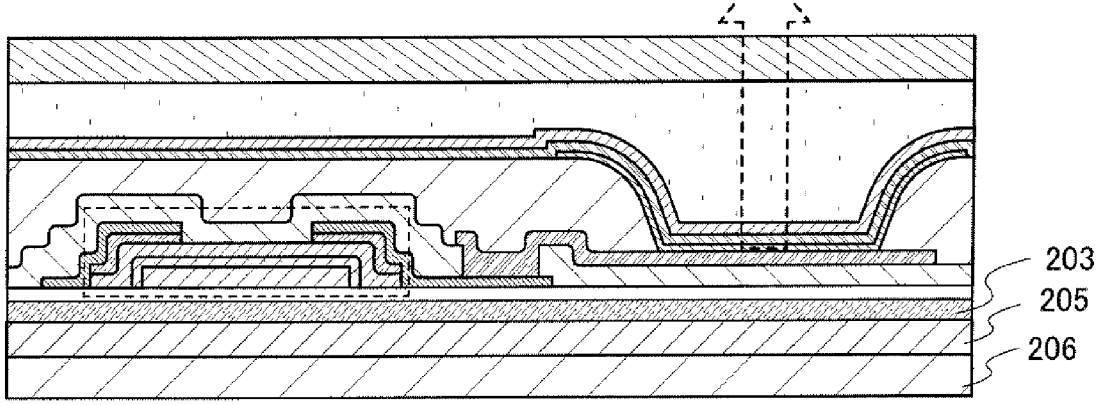

Next, in order to increase the mechanical strength of the light-emitting device, a flexible substrate 206 is fixed to a surface on which the separation has been performed, i.e., the amorphous silicon film 203, with the use of an adhesive layer 205, as shown in FIG. 2D. If the light-emitting device has enough mechanical strength, the flexible substrate 206 is not particularly necessary.

Through the steps given above, an active matrix light-emitting device that uses an organic transistor can be manufactured. Since this embodiment mode shows the example of the light-emitting device in which emitted light passes through the flexible substrate 225, the amorphous silicon film 203 remains in the light-emitting device.

The first electrode 210 may be formed using a transparent conductive film and the second electrode 223 may be formed of a metal material that reflects light, such as aluminum, silver, or an alloy including any of them. In this case, the amorphous silicon film 203 is preferably removed after the separation step.

Figure 3A:
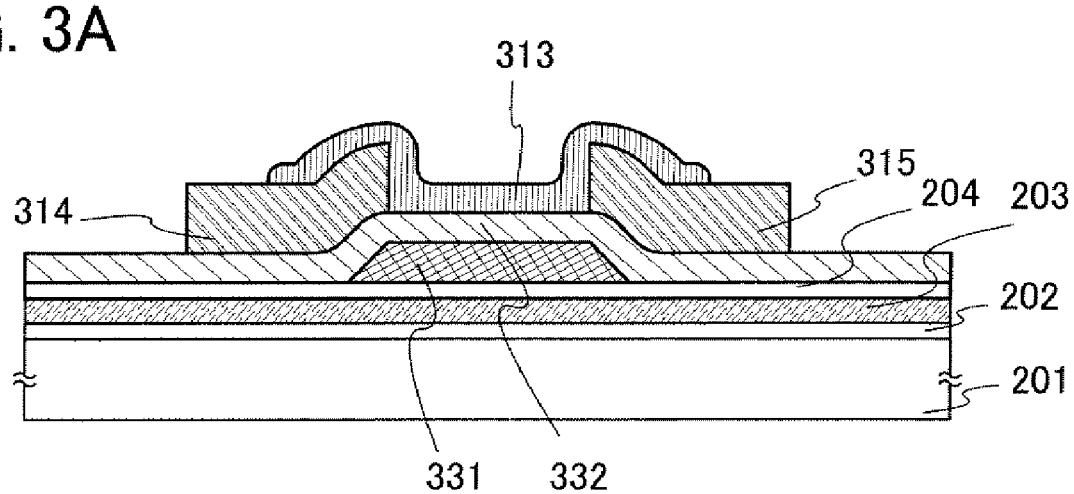
FIGS. 3A and 3B each show an example of a cross-sectional structure of an organic TFT (Embodiment Mode 2).
Figure 3B:
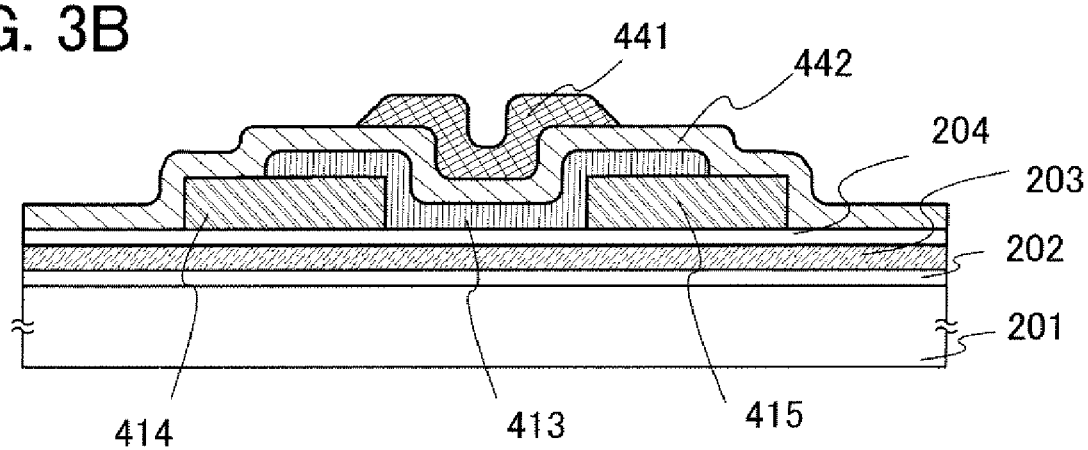

Instead of the structure shown in FIG. 2C, the organic transistor may have a structure shown in FIG. 3A or 3B.

FIG. 3A illustrates a structure called a bottom-contact structure. It is to be noted that portions that are the same as those in FIGS. 2A to 2D are denoted by the same reference numerals. In the case of using the bottom-contact structure, a step of photolithography or the like can be carried out easily for microfabrication of a source wiring and a drain wiring. For this reason, the structure of the organic transistor may be selected as appropriate based on its advantages and disadvantages.

The first silicon oxide film 202, the amorphous silicon film 203, and the second silicon oxide film 204 are stacked over the substrate 201. A gate electrode 331 is formed over the second silicon oxide film 204. There is no particular limitation on a material used to form the gate electrode 331. For example, a metal such as gold, platinum, aluminum, tungsten, titanium, copper, molybdenum, tantalum, niobium, chromium, nickel, cobalt, or magnesium; an alloy that contains any of these metals; a conductive macromolecular compound such as polyaniline, polypyrrole, polythiophene, polyacetylene, or polydiacetylene; polysilicon that is doped with an impurity; and the like can be given. It is to be noted that there is no particular limitation on the formation method of the gate electrode 331, and the gate electrode 331 may be manufactured by being processed into a desired shape by a method of etching or the like after film formation by a sputtering method, an evaporation method, or the like. Furthermore, the gate electrode 331 may be formed by an inkjet method or the like by using droplets that contain a conductor.

Next, an insulating film 332 that covers the gate electrode 331 is formed. The insulating film 332 is formed using an inorganic insulating material such as silicon oxide, silicon nitride, or silicon oxynitride. It is to be noted that the insulating film 332 of any of these materials can be formed by a coating method such as a dipping method, a spin coating method, or a droplet discharging method; a CVD method; a sputtering method; or the like. This insulating film 332 may be subjected to nitridation and/or oxidation by using high-density plasma. By high-density plasma nitridation, a silicon nitride film that contains nitrogen at a higher concentration can be obtained. The high-density plasma is generated by use of high-frequency microwaves, for example, microwaves with a frequency of 2.45 GHz. By use of this kind of high-density plasma, oxygen (or a gas that contains oxygen), nitrogen (or a gas that contains nitrogen), or the like can be activated by plasma excitation, and these are made to react with the insulating film. In high-density plasma that has the characteristic of having a low electron temperature, since the kinetic energy of an active species is low, a film can be formed with less plasma damage and fewer defects compared to a film formed by conventional plasma treatment. In addition, with use of high-density plasma, because the surface of the insulating film 332 can be made less rough, carrier mobility can be increased. Furthermore, the orientation of organic semiconductor materials used to form the semiconductor layer over the insulating film 332, which functions as a gate insulating film, becomes easy to align.

Next, a source electrode 314 and a drain electrode 315 are formed over the insulating film 332. Then, a semiconductor layer 313 is formed between the source electrode 314 and the drain electrode 315. For the semiconductor layer 313, the same materials as that used to form the semiconductor layer 213 shown in FIG. 2B described above can be used. After forming the organic transistor with such a structure, separation is performed and the organic transistor is transferred to the flexible substrate.

Furthermore, a structure of FIG. 3B will be described. The structure of FIG. 3B is a structure that is referred to as a top-gate structure. It is to be noted that portions that are the same as those in FIGS. 2A to 2D are denoted by the same reference numerals.

The first silicon oxide film 202, the amorphous silicon film 203, and the second silicon oxide film 204 are stacked over the substrate 201. A source electrode 414 and a drain electrode 415 are formed over the second silicon oxide film 204. Next, a semiconductor layer 413 is formed between the source electrode 414 and the drain electrode 415. Then, an insulating film 442 is formed to cover the semiconductor layer 413, the source electrode 414, and the drain electrode 415. Next, a gate electrode 441 is formed over the insulating film 442. The gate electrode 441 overlaps with the semiconductor layer 413 with the insulating film 442 interposed therebetween. After forming the organic transistor with such a structure, separation is performed and the organic transistor is transferred to the flexible substrate.

In this manner, even with these kinds of structures of organic transistors, separation can be performed and the organic transistors can be transferred to a flexible substrate by the present invention.

Instead of the organic transistor, a transistor with its semiconductor layer including an oxide of zinc-gallium-indium or zinc oxide which is manufactured by a sputtering method or a PLD method can also be used. In this case, the structure of FIG. 3A or 3B can be applied. When the semiconductor layer includes zinc oxide or an oxide of zinc-gallium-indium, the gate insulating film is preferably formed of an oxide including aluminum or titanium. In this manner, the present invention is effective even when a transistor is formed through a process in which the substrate is irradiated with plasma. After the transistor is formed over a plasma-resistant substrate, the transistor can be separated and transferred to the flexible substrate.

This embodiment mode can be freely combined with Embodiment Mode 1. For example, a liquid crystal display device can be manufactured by using the organic transistor shown in Embodiment Mode 2 instead of the amorphous TFT shown in Embodiment Mode 1. Moreover, a light-emitting device can be manufactured by using the amorphous TFT shown in Embodiment Mode 1 instead of the organic transistor shown in Embodiment Mode 2.

Embodiment Mode 3

Here, an example of manufacturing a passive matrix light-emitting device by using a flexible substrate will be explained with reference to FIGS. 5A to 9.

A passive matrix (simple matrix) light-emitting device has a structure in which a plurality of anodes is provided in parallel stripe form (band form) and a plurality of cathodes is provided in parallel stripe form so that the anodes and the cathodes are perpendicular to each other and in which a light-emitting layer or a fluorescent layer is inserted at an intersection of the anode and the cathode. Consequently, a pixel located at an intersection of a selected (voltage-applied) anode and a selected cathode comes to be lit up.

FIG. 5A is a diagram illustrating a top view of a pixel portion before sealing. FIG. 5B is a cross-sectional view taken along a chain line A-A in FIG. 5A, and FIG. 5C is a cross-sectional view taken along a chain line B-B' in FIG. 5A.

Over a first substrate 501, as in Embodiment Mode 2, a first silicon oxide film 502, an amorphous silicon film 503 containing fluorine, and a second silicon oxide film 504 are stacked. Over the second silicon oxide film 504, a plurality of first electrodes 513 is arranged in stripe form at an equal distance to each other. Furthermore, over the first electrodes 513, a partition wall 514 that has openings, with each opening corresponding to a pixel, is provided, and the partition wall 514 that has openings is formed of an insulating material (a photosensitive or non-photosensitive organic material (polyimide, acrylic, polyamide, polyimide-amide, or benzocyclobutane) or an SOG film (for example, an $SiO_x$ film that has an alkyl group)). It is to be noted that each opening corresponding to a pixel serves as a light-emitting region 521.

Over the partition wall 514 that has openings, a plurality of mutually-parallel reversely-tapered partition walls 522 is provided to intersect with the first electrodes 513. The reversely-tapered partition walls 522 are formed by a photolithography method in such a way that a positive photosensitive resin of which unexposed part is left remaining as a pattern is used and the amount of exposure to light and length of time for image development are adjusted so that the lower part of the pattern is etched more than the other parts.

Figure 6:
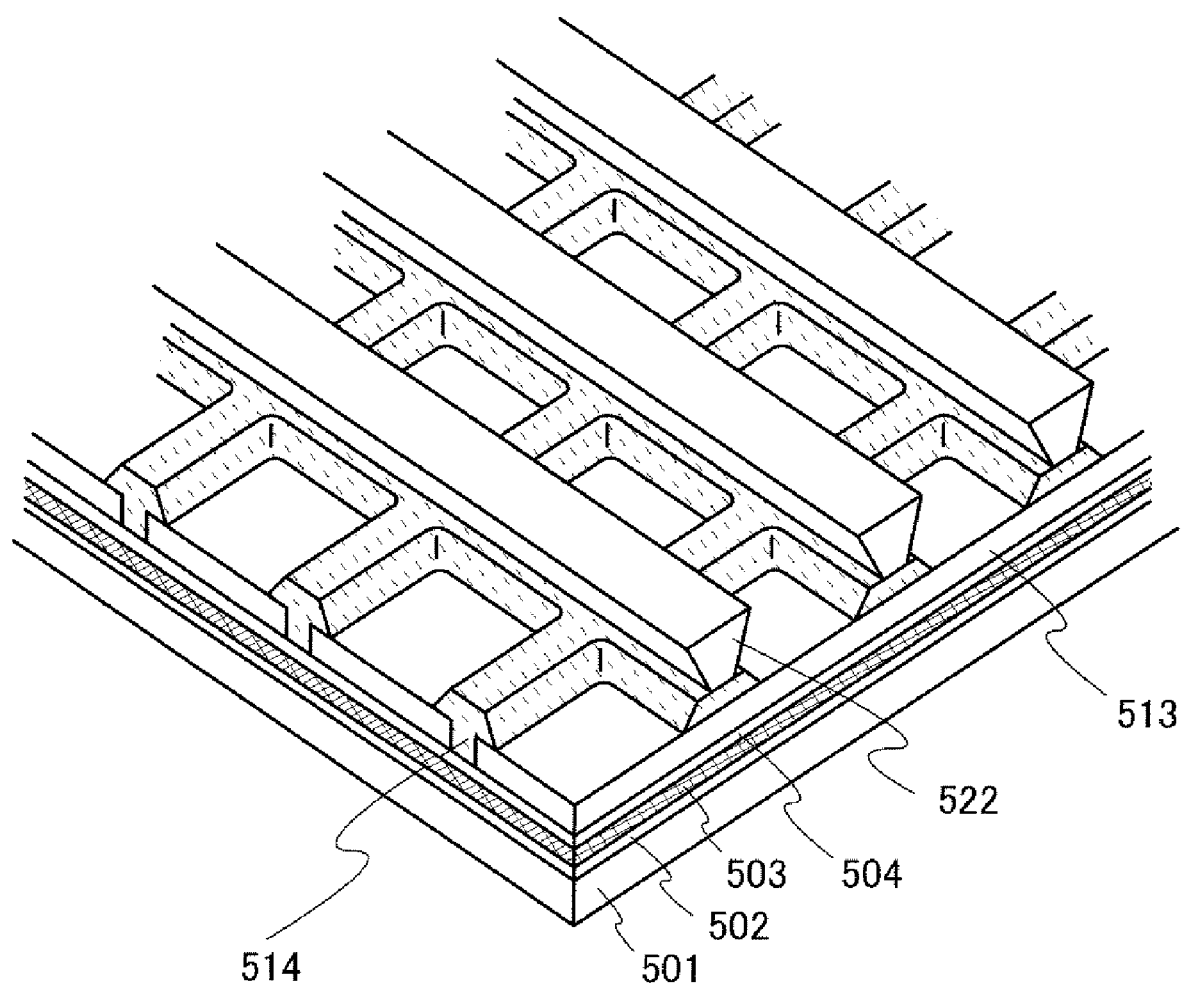
FIG. 6 is a perspective view of a passive matrix light-emitting device (Embodiment Mode 3).

FIG. 6 is a perspective view illustrating the device right after the plurality of parallel reversely-tapered partition walls 522 is formed. The same portions as those in FIGS. 5A to 5C are denoted by the same reference numerals.

The height of the reversely-tapered partition walls 522 is set to be greater than the combined film thicknesses of a conductive film and a stacked-layer film that, includes a light-emitting layer. A stacked-layer film that includes a light-emitting layer, and a conductive film are formed and stacked with respect to the first substrate having the structure shown in FIG. 6. Then, the films are isolated into a plurality of electrically independent regions as shown in FIGS. 5A to 5C, and stacked-layer films 515R, 515G, and 515B that each include a light-emitting layer, and second electrodes 516 are formed. The second electrodes 516 are electrodes of mutually-parallel stripe form, which extend in a direction intersecting with the first electrodes 513. It is to be noted that the stacked-layer film including a light-emitting layer and a conductive film are also formed over the reversely-tapered partition walls 522; however, they are isolated from the stacked-layer films 515R, 515G, and 515B that each include a light-emitting layer, and the second electrodes 516.

Here, an example of forming a light-emitting device is shown. The light-emitting device shown here is capable of full-color display where emission of three different colors of light (R, C, and B) is obtained by selective formation of the stacked-layer films 515R, 515G, and 515B that each includes a light-emitting layer. The stacked-layer films 515R, 515G, and 515B that each includes a light-emitting layer are formed into a mutually-parallel stripe pattern.

Furthermore, light-emitting elements of a single color may be provided by formation of stacked-layer films including light-emitting layers which emit light of the same emission color over the entire surface, and the light-emitting device may be set to be one capable of monochrome display or one capable of area color display. In addition, a light-emitting display device capable of full-color display may be obtained by a combination of a color filter and a light-emitting device capable of white light emission.

Figure 7:
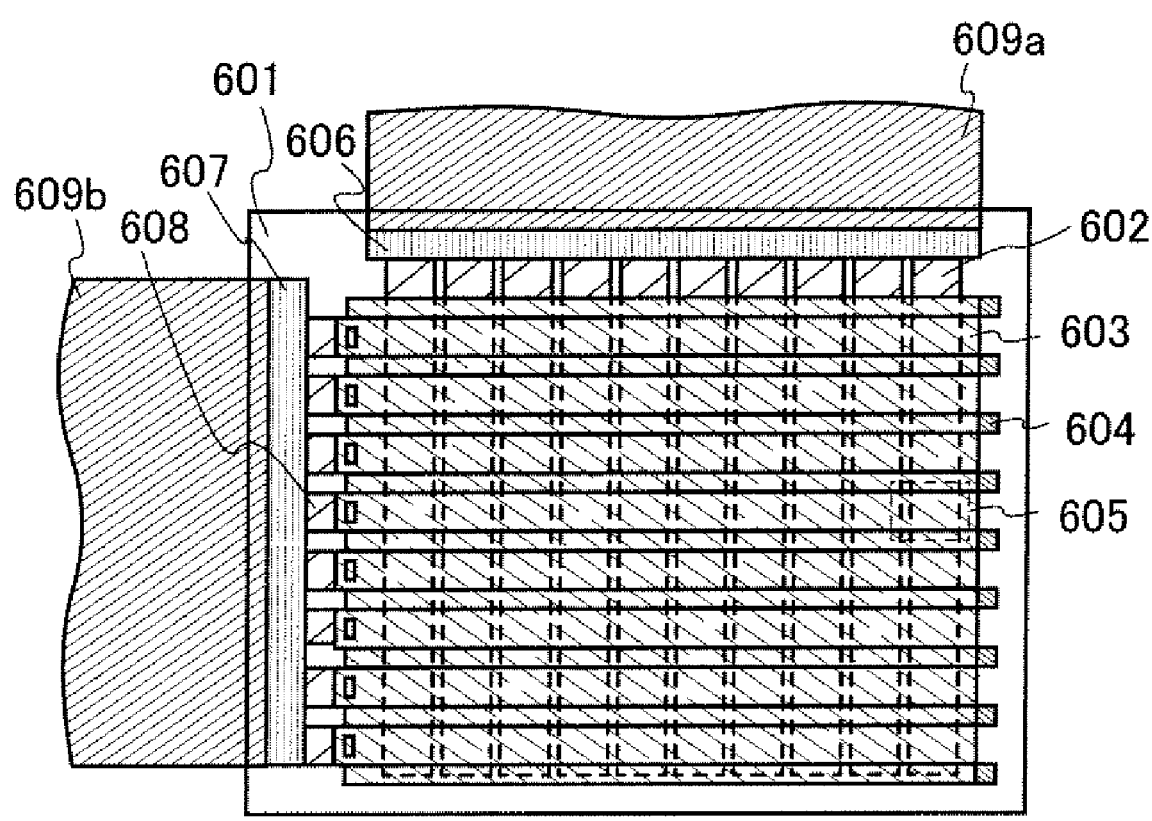
FIG. 7 is a top view of a passive matrix light-emitting device (Embodiment Mode 3).

Next, a top view of a light-emitting module in which an FPC and the like are provided is shown in FIG. 7.

It is to be noted that "light-emitting device" in the present specification refers to an image display device, a light-emitting device, or a light source (which includes a lighting device). Moreover, a module in which a connector, for example, a flexible printed circuit (FPC), a tape automated bonding tape (TAB tape), or a tape carrier package (TCP) is attached to a light-emitting device; a module in which an edge of a TAB tape or a TCP is attached to a printed circuit board; and a module in which an integrated circuit (IC) is directly mounted on a light-emitting device by a chip on glass (COG) method are all considered to be included in the term "light-emitting device."

In a pixel portion performing image display as shown in FIG. 7, scanning lines and data lines are arranged to intersect with each other so that the scanning lines and data lines are mutually orthogonal.

The first electrode 513, the second electrode 516, and the reversely-tapered partition wall 522 of FIGS. 5A to 5C correspond to a scanning line 603, a data line 602, and a partition wall 604 of FIG. 7, respectively. A light-emitting layer is interposed between the data line 602 and the scanning line 603, and an intersection indicated by a region 605 is defined as a single pixel.

It is to be noted that the scanning line 603 is electrically connected to a connecting wiring 608 at an edge of the wiring, and the connecting wiring 608 is connected to an FPC 609b via an input terminal 607. In addition, the data line 602 is connected to an FPC 609a via an input terminal 606.

Next, a first flexible substrate is fixed using a first adhesive layer.

Next, the light-emitting element is separated from the first substrate 601. Subsequently, in order to seal the light-emitting device more firmly, a second flexible substrate is fixed to a surface where the separation has been performed, with the use of a second adhesive layer.

In addition, if needed, optical films such as a polarizer, a circular polarizer (including an elliptical polarizer), a retarder plate (a quarter-wave plate, a half-wave plate), or a color filter may be provided on an emission surface, as appropriate. Moreover, the polarizer or circular polarizer may be provided with an antireflective film. For example, antiglare treatment can be performed by which reflected light is diffused on unevenness of a surface so as to reduce glare.

Through the above steps, a flexible passive matrix light-emitting device can be manufactured. Because thermocompression bonding is performed to mount an FPC, it is preferable that mounting of the FPC by thermocompression bonding be performed on a hard substrate. In accordance with the present invention, separation can be performed after mounting the FPC and the elements can be transferred to the flexible substrate.

The example in which the driver circuit is not provided over the substrate has been explained with reference to FIG. 7. An example of a method of manufacturing a light-emitting module in which an IC chip having a driver circuit is provided will hereinafter be described with reference to FIGS. 8A and 8B.

First, over a first substrate 701, as in Embodiment Mode 2, a first silicon oxide film, an amorphous silicon film containing fluorine, and a second silicon oxide film are formed, Over this second silicon oxide film, a data line 702 (which also functions as an anode) is formed. The data line 702 has a stacked-layer structure where the lower layer is a reflective metal film and the upper layer is a transparent conductive oxide film. Simultaneously, connecting wirings 708, 709a, and 709b and input terminals are formed.

Figure 8A:
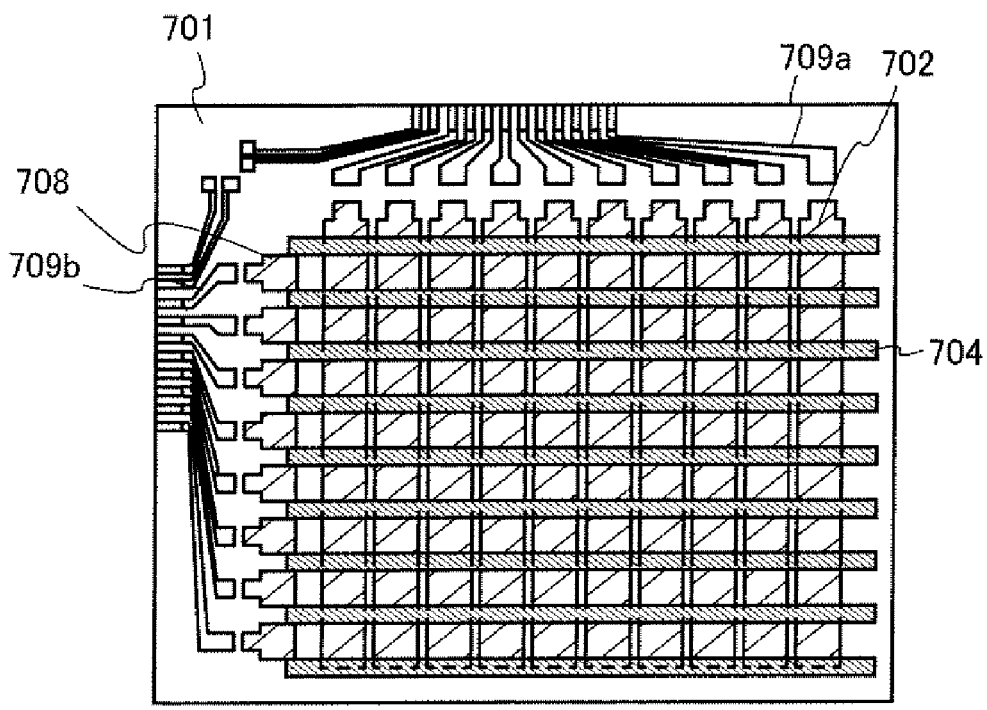
FIGS. 8A and 8B are top views each showing a passive matrix light-emitting device (Embodiment Mode 3).

Next, a partition wall that has openings, with each opening corresponding to a pixel 705, is provided. Then, over the partition wall that has openings, a plurality of mutually-parallel reversely-tapered partition walls 704 is formed to intersect with the data lines 702. A top-view diagram of what is obtained after the steps outlined above have been completed is shown in FIG. 8A.

Figure 8B:
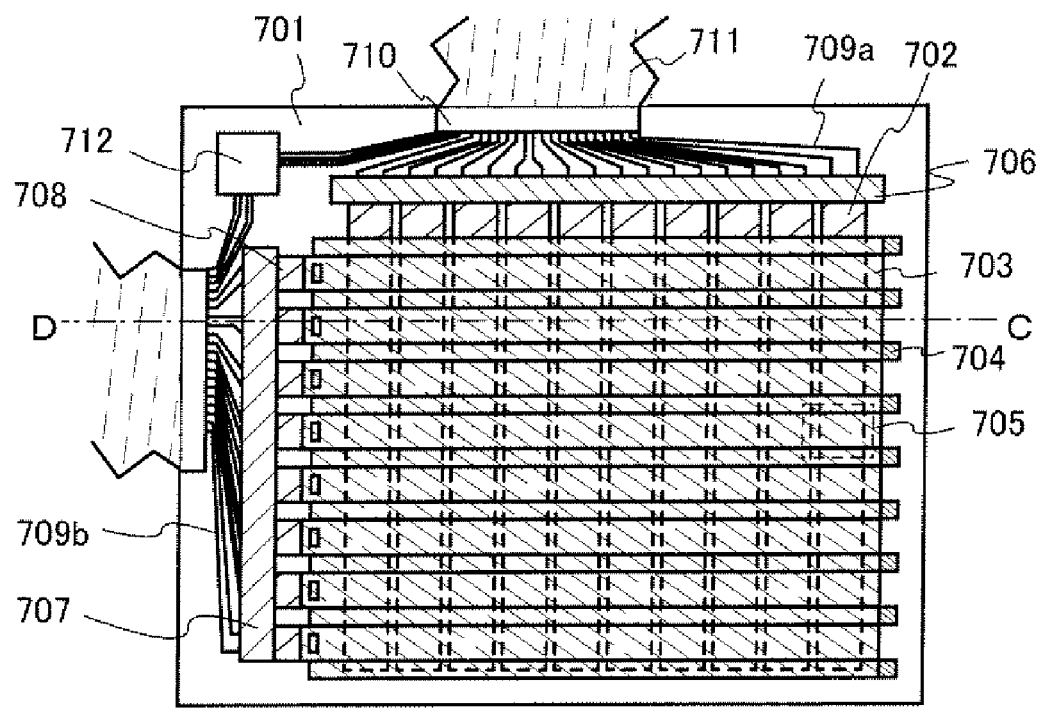

Subsequently, a stacked-layer film that includes a light-emitting layer and a transparent conductive film are formed and stacked, and then they are isolated into a plurality of electrically independent regions as shown in FIG. 8B. Thus, the stacked-layer film including a light-emitting layer and scanning lines 703 including a transparent conductive film are formed. The scanning lines 703 formed using a transparent conductive film are electrodes of mutually-parallel stripe form that extend in a direction of intersection with the data lines 702.

Next, in a region at the periphery (outer side) of a pixel portion, an IC 706 on the data line side and an IC 707 on the scanning line side, each of which has a driver circuit that is used to transmit a variety of signals to the pixel portion, are mounted by a COG method. TCP or a wire bonding method may be used as a mounting technique, instead of the COG method. TCP is a method in which an IC is mounted on a TAB tape and the TAB tape is connected to a wiring over an element formation substrate, so that an IC is mounted. The IC 706 on the data line side and the IC 707 on the scanning line side may be ICs formed using a silicon substrate, or they may have driver circuits formed using TFTs over a glass substrate, a quartz substrate, or a plastic substrate. In addition, an example is shown in which one IC is provided on one side; however, a plurality of ICs, divided into individual parts, may be provided on one side.

It is to be noted that each of the scanning lines 703 is electrically connected to one of the connecting wirings 708 at the edge of the wiring, and each of the connecting wirings 708 is connected to the IC 707 on the scanning line side. This is because forming the IC 707 on the scanning line side over the reversely-tapered partition walls 704 is difficult.

The IC 706 on the data line side, which is provided to have the structure described above, is connected to an FPC 711 via the connecting wiring 709a and an input terminal 710. Furthermore, the IC 707 on the scanning line side is connected to an FPC via the connecting wiring 709b and an input terminal.

Moreover, integration is achieved by mounting an IC chip 712 (a memory chip, a CPU chip, a power supply circuit chip, or the like).

Next, a first flexible substrate is fixed using a first adhesive layer so as to cover the pixel portion.

Next, the light-emitting element is separated from the first substrate 701. Subsequently, in order to seal the light-emitting device more firmly, a second flexible substrate is fixed onto a surface where the separation has been performed, with the use of a second adhesive layer.

Figure 9:
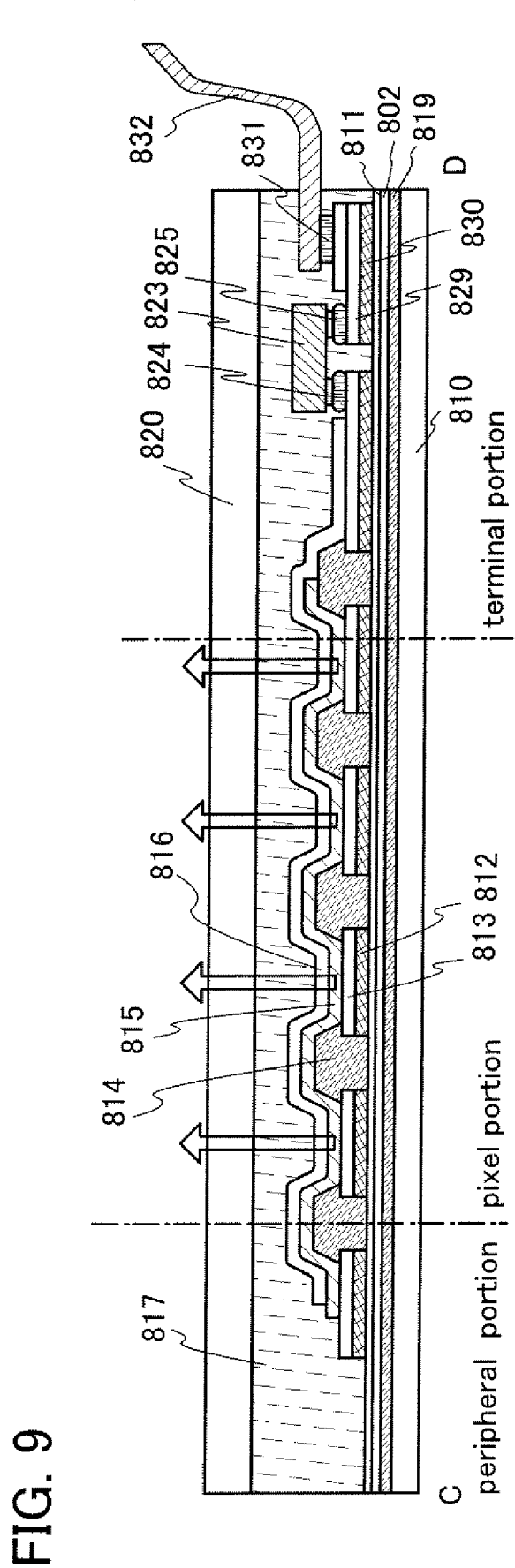
FIG. 9 is a cross-sectional view of a passive matrix light-emitting device (Embodiment Mode 3).

FIG. 9 shows an example of a cross-sectional structure taken along a chain line C-D of FIG. 8B after fixing the second flexible substrate.

An amorphous silicon film 802 containing fluorine and a second silicon oxide film 811 are provided over a second flexible substrate 810 with the use of a second adhesive layer 819. A lower layer 812 is a reflective metal film and an upper layer 813 is a transparent conductive oxide film. The upper layer 813 is preferably formed using a conductive film that has a high work function; as well as a film that contains indium tin oxide, for example, a film that contains a transparent conductive material such as indium tin oxide containing silicon or indium zinc oxide (IZO) in which zinc oxide is mixed into indium oxide, or a compound of a combination of any of these materials can be used. In addition, the lower layer 812 is formed using a silver film, an aluminum film, or an aluminum-alloy film.

A partition wall 814 for insulating adjacent data lines from each other is formed of resin, and regions surrounded by the partition wall all have the same area corresponding to light-emitting regions.

A scanning line 816 (cathode) is formed so as to intersect with a data line (anode). The scanning line 816 (cathode) is formed using a transparent conductive film such as a film of indium tin oxide, indium tin oxide containing silicon, or indium zinc oxide (IZO) in which zinc oxide is mixed into indium oxide. Because the light-emitting device of the present embodiment mode is an example of a top-emission light-emitting device in which emitted light passes through a first flexible substrate 820, it is important that the scanning line 816 is transparent.

Furthermore, the first flexible substrate 820 is attached to seal a pixel portion in which each of a plurality of light-emitting elements is arranged at a point of intersection of a scanning line and a data line that sandwich a stacked-layer film 815 having a light-emitting layer, and the pixel portion is filled with a first adhesive layer 817. For the first adhesive layer 817, a UV curable resin, a thermosetting resin, a silicone resin, an epoxy resin, an acrylic resin, a polyimide resin, a phenolic resin, polyvinyl chloride (PVC), polyvinyl butyral (PVB), or ethylene vinyl acetate (EVA) can be used.

A terminal electrode is formed at an edge of the second flexible substrate 810. At this edge, an FPC (flexible printed circuit board) 832 that is connected to an external circuit is attached. The terminal electrode is formed using stacked layers of a reflective metal film 830, a transparent conductive oxide film 829, and a conductive oxide film that extends from the second electrode; however, there is no particular limitation on the structure of the terminal electrode.

As the method for mounting the FPC 832, a connection method that uses an anisotropic conductive material or a metal bump or a wire bonding method can be employed. In FIG. 9, the connection is performed using an anisotropic conductive adhesive 831.

In addition, an IC chip 823 provided with a driver circuit that is used to transmit a variety of signals to the pixel portion is electrically connected to the periphery of the pixel portion by anisotropic conductive materials 824 and 825. Moreover, in order to form a pixel portion corresponding to color display of XGA class, 3072 data lines and 768 scanning lines are necessary. The data lines and scanning lines formed at these numbers are sectioned for every several blocks at an edge of the pixel portion, thereby forming lead wirings. The lead wirings are collected in accordance with the pitch of output terminals of the IC.

Through the above steps, a light-emitting module with the IC chip mounted, the IC chip being sealed by the second flexible substrate 810 and the first flexible substrate 820, can be manufactured. Because thermocompression bonding is performed to mount the IC chip, it is preferable that mounting of the IC by thermocompression bonding be performed on a hard substrate. In accordance with the present invention, separation can be performed after mounting the IC chip and the elements can be transferred to the flexible substrate.

Although this embodiment mode shows the example of the light-emitting device which has the amorphous silicon film 802 containing fluorine, there is no particular limitation and the amorphous silicon film 802 containing fluorine may be removed after the separation. Moreover, when the amorphous silicon film 802 containing fluorine is formed so as to have a concentration peak of fluorine near the interface between the amorphous silicon film 802 and the second silicon oxide film 811, which is formed later, detachment can be performed at the interface between the amorphous silicon film 802 and the second silicon oxide film 811.

This embodiment mode can be freely combined with the other Embodiment Modes.

Embodiment Mode 4

This embodiment mode will show an example of manufacturing a semiconductor device functioning as a wireless chip. The semiconductor device shown in the present embodiment mode is a device by which reading and writing of data can be carried out without contact. Data transmission types are roughly divided into three types: an electromagnetic coupling method in which a pair of coils is arranged opposite to each other and data is communicated by mutual induction, an electromagnetic induction method in which data is communicated by an induction electromagnetic field, and an electric wave method in which data is communicated using electric waves. Any of these methods may be used.

Furthermore, there are two ways for providing an antenna used for the data transmission. One way is to provide an antenna over an element substrate where a plurality of elements and a memory element are provided. The other way is to provide a terminal portion over an element substrate where a plurality of elements and a memory element are provided, and an antenna provided to a separate substrate is connected to the terminal portion.

A manufacturing method in the case where an antenna provided to a separate substrate is connected to a terminal portion of an element substrate will hereinafter be presented in this embodiment mode.

Figure 10A:
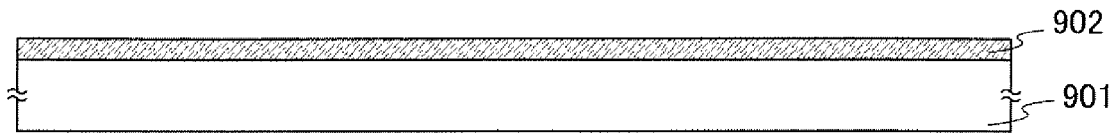
FIGS. 10A to 10D are cross-sectional views showing manufacturing steps of an antenna.

First, as in Embodiment Mode 1, an amorphous silicon film 902 containing fluorine is formed over a heat-resistant substrate 901 so that there is a concentration peak of fluorine toward a surface of the amorphous silicon film 902 containing fluorine, A cross-sectional process diagram of the substrate after processes up to this stage have been completed is shown in FIG. 10A. As the heat-resistant substrate 901, a substrate in which an inorganic component and an organic component are combined at a molecular level is used. As well as a substrate having a light-transmitting property, a substrate which resists baking temperatures (about 300° C.) of a conductive layer formed by a coating method and which does not change in shape largely may be used as the heat-resistant substrate.

Alternatively, a semiconductor substrate, a glass substrate, a quartz substrate, or a ceramic substrate can be used as the heat-resistant substrate. However, a plastic substrate which has low heat resistance against heat treatment at 300° C. for 30 minutes is not suitable for the heat-resistant substrate 901 because it may bend.

Figure 10B:
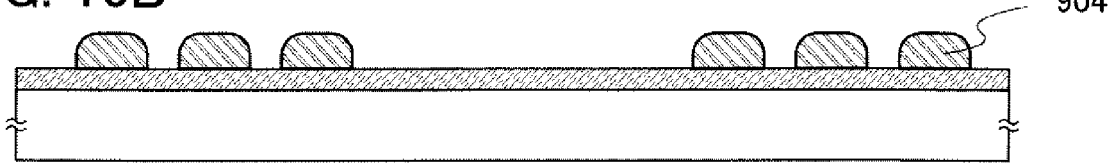

Subsequently, a conductive layer 904 functioning as an antenna is formed over the amorphous silicon film 902 containing fluorine, as shown in FIG. 10B. The conductive layer 904 functioning as an antenna is formed by discharging droplets or paste containing a conductor such as gold, silver, or copper by a droplet discharging method (such as an inkjet method or a dispensing method) and drying and baking the droplets or paste. By the formation of the conductive layer 904 by a droplet discharging method, the number of steps can be reduced, which leads cost reduction. Alternatively, the conductive layer 904 may be formed by a screen printing method. In the case of using a screen printing method, as a material of the conductive layer 904 functioning as an antenna, a conductive paste in which conductive particles, each with a diameter of from several nanometers to several tens of micrometers, are dissolved in or dispersed throughout an organic resin is printed as selected. For the conductive particles, metal particles of one or more of silver, gold, copper, nickel, platinum, palladium, tantalum, molybdenum, or titanium; microparticles of a silver halide; or dispersive nanoparticles can be used. Moreover, for the organic resin that is contained in the conductive paste, one or more organic resins selected from organic resins that function as binders, solvents, dispersants, or coating materials of metal particles can be used. Typically, organic resins such as an epoxy resin and a silicone resin can be given. Furthermore, in the formation of the conductive layer 904, it is preferable that the conductive paste be baked after being extruded. Alternatively, microparticles containing solder or lead-free solder as the main component may be used, and in this case, it is preferable that fine particles with a diameter of 20 μm or less be used. Solder and lead-free solder both have an advantage in that they are inexpensive. Instead of the materials given above, ceramic, ferrite, or the like may be applied for the antenna.

In the case where the antenna is manufactured using a screen printing method or a droplet discharging method, after formation of the antenna into a desired shape, baking is performed. The baking is performed at temperatures ranging from 200° C. to 300° C. The baking is possible even at temperatures lower than 200° C.; however, when the baking temperature is lower than 200° C., there is a risk that the conductivity of the antenna cannot be maintained or that even the communication distance for the antenna will become short. In consideration of these points, it is preferable that, after the antenna is formed over a separate substrate, namely, a heat-resistant substrate, the antenna be separated from the substrate and transferred to an element substrate. When a memory element using an organic material is employed as a memory element provided to the element substrate, there is a risk that the memory element changes in quality depending on the baking temperature of the antenna, which affects data writing and the like. Even in this point, it is advantageous that the antenna provided to a separate substrate is connected to the terminal portion of the element substrate.

Moreover, the antenna may be formed by gravure printing or the like instead of being formed by a screen printing method, or the antenna can be formed of a conductive material by using a plating method or the like. In some cases, an antenna formed by a plating method has low adhesiveness depending on a plating material and a plating condition; therefore, it is effective to employ a separation method which uses an amorphous silicon film containing fluorine of the present invention.

Figure 10C:
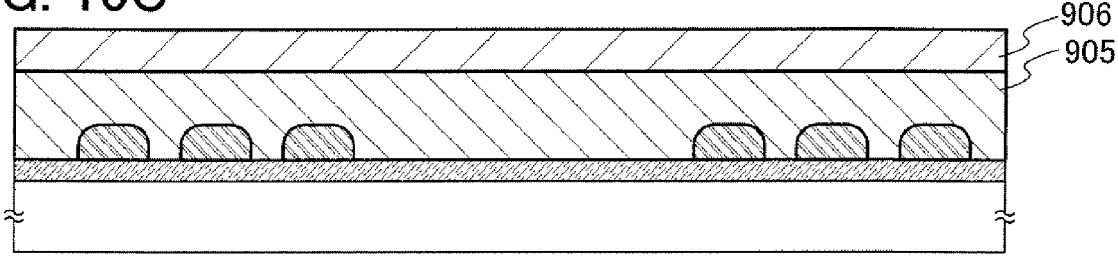

Subsequently, a flexible substrate 906 is attached using a resin layer 905 in order to protect the conductive layer 904, as shown in FIG. 10C.

Figure 10D:
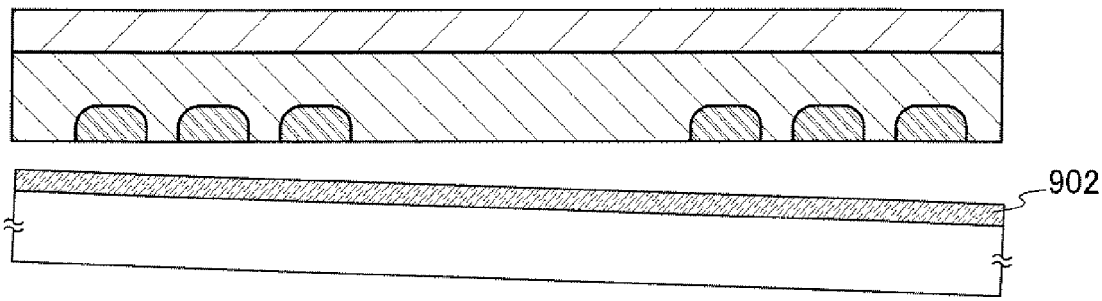

Next, separation is performed as shown in FIG. 10D, so that the conductive layer 904, the resin layer 905, and the flexible substrate 906 can be detached from the heat-resistant substrate 901 and the amorphous silicon film 902 containing fluorine. It is to be noted that the detachment is performed at an interface between the amorphous silicon film containing fluorine and the conductive layer 904, i.e., an interface of the amorphous silicon film near which much fluorine is contained. As long as the flexible substrate 906 has sufficient adhesiveness with respect to the conductive layer 904 by the resin layer 905, separation can be performed by pulling the flexible substrate 906 after fixing the resin layer 905. The yield increases because the separation can be performed by the addition of only relatively weak force in the separation method using the amorphous silicon film containing fluorine of the present invention. Since the separation can be performed by the addition of only relatively weak force in the separation method using the amorphous silicon film containing fluorine of the present invention, change in shape of the flexible substrate 906 occurring while separation is performed can be suppressed, and the amount of damage that the conductive layer 904 receives can be reduced. Moreover, in the separation method using the amorphous silicon film containing fluorine of the present invention, the conductive layer 904 can be exposed; therefore, in a case of connection with another element, electrical connection with another element is easy.

Figure 10E:
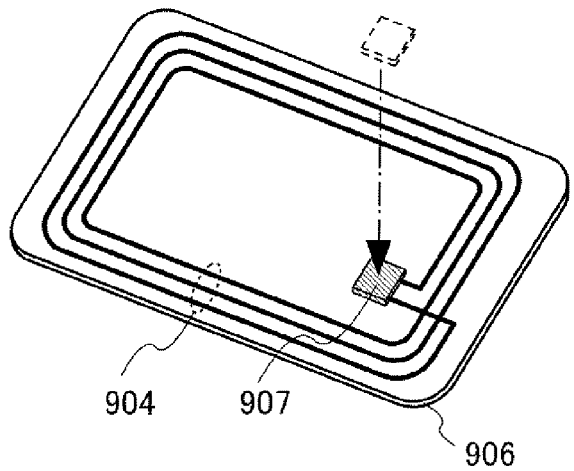
FIG. 10E is a perspective view showing a manufacturing step of a semiconductor device.
Figure 11A:
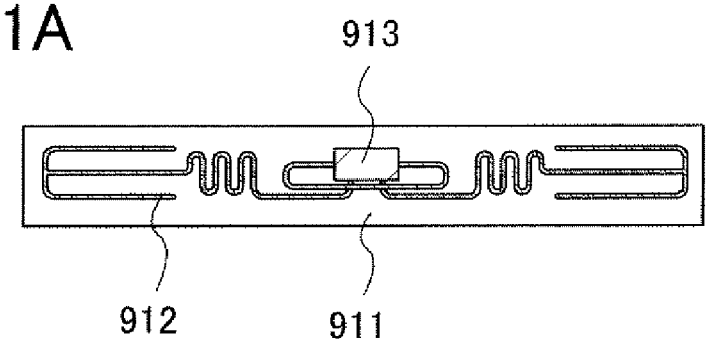
FIGS. 11A to 11D are top views each showing a semiconductor device functioning as a wireless chip.
Figure 11B:
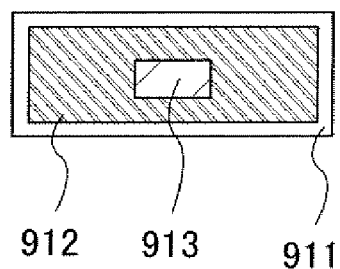
Figure 11C:
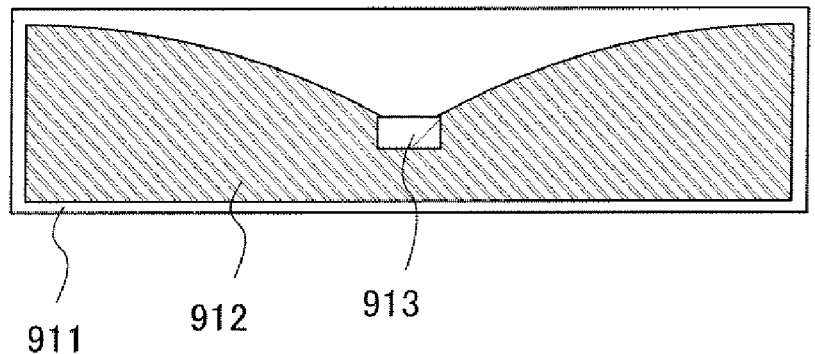
Figure 11D:
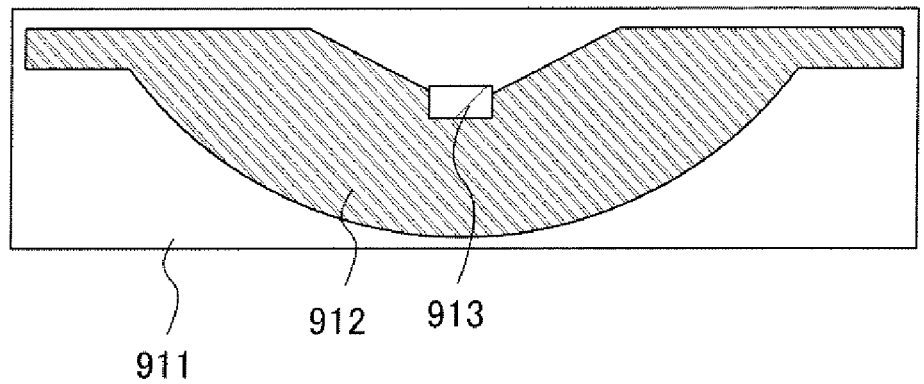

Next, by compression bonding using an anisotropic conductive material, a terminal portion of the element substrate and the conductive layer 904 are electrically connected to each other. As shown in FIG. 10E, an element substrate 907 is disposed in contact with a surface on which the conductive layer 904 is formed.

Although FIG. 10E shows the example of the element substrate 907 which has a smaller area than the flexible substrate 906, there is no particular limitation, and the element substrate 907 may have almost the same area as the flexible substrate 906 or may have a larger area than the flexible substrate 906.

Finally, another flexible substrate is attached so as to cover the antenna and the element substrate 907, thereby completing a semiconductor device functioning as a wireless chip. When there is no need, another flexible substrate does not have to be attached.

Here, as a method of transmitting signals in the semiconductor device, an electromagnetic coupling method or an electromagnetic induction method (for example, 13.56 MHz band) is applied. Because electromagnetic induction by change in magnetic field density is used, the upper surface of the conductive layer that functions as an antenna is formed into a ring shape (for example, as a loop antenna) or a spiral shape (for example, as a spiral antenna) in FIG. 10; however, there is no particular limitation on the shape into which the conductive layer is formed.

Alternatively, as a method of transmitting signals in the semiconductor device, a microwave (for example, UHF band (from 860 MHz to 960 MHz), 2.45 GHz band, or the like) method can be applied. In this case, the shape such as the length of the conductive layer that functions as an antenna may be set as appropriate in consideration of the wavelength of the electromagnetic waves used in the transmission of signals. Examples of a conductive layer 912 functioning as an antenna and a chip-form semiconductor device 913 having an integrated circuit, which are formed over a flexible substrate 911, are shown in FIGS. 11A to 11D. For example, an upper surface of the conductive layer that functions as an antenna can be formed into a linear shape (for example, as a dipole antenna (see FIG. 11A)), a planar shape (for example, as a patch antenna (see FIG. 11B)), a ribbon shape (see FIGS. 11C and 11D), or the like. In addition, the shape of the conductive layer that functions as an antenna is not limited to being a linear shape but the conductive layer may be formed into a curved-line shape or a meandering shape or into a shape that is a combination of any of these shapes, in consideration of the wavelengths of the electromagnetic waves.

Figure 12A:
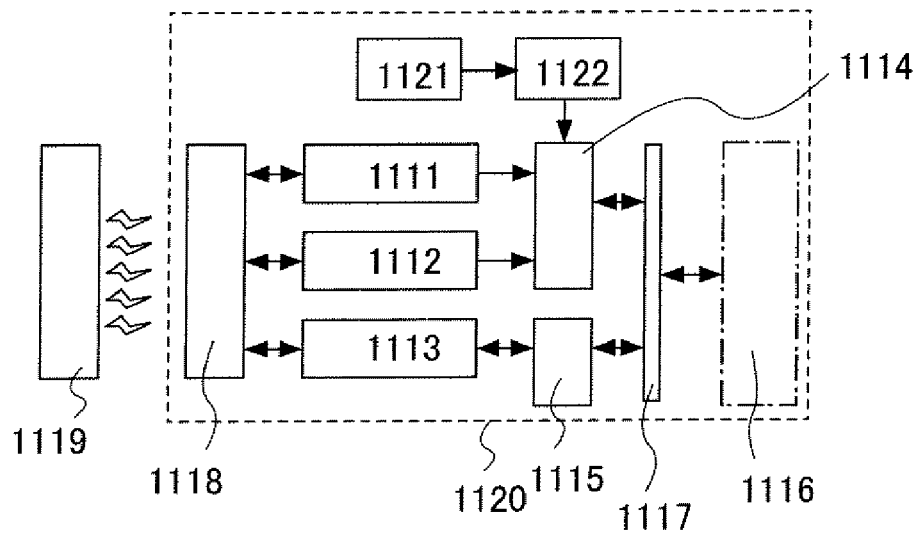
FIG. 12A is a block diagram showing a semiconductor device of the present invention.

Furthermore, a structure of the semiconductor device obtained through the above steps will be described with reference to FIG. 12A. As shown in FIG. 12A, a semiconductor device 1120 obtained by the present invention has a function of communicating data without contact and has a power supply circuit 1111, a clock generator circuit 1112, a data demodulation or modulation circuit 1113, a controller circuit 1114 that is used to control another circuit, an interface circuit 1115, a memory circuit 1116, a data bus 1117, an antenna 1118, a sensor 1121, and a sensor circuit 1122.

The power supply circuit 1111 is a circuit that generates a variety of power sources supplied to internal circuits of the semiconductor device 1120 based on alternating current signals input from the antenna 1118. The clock generator circuit 1112 is a circuit that generates a variety of clock signals that are supplied to internal circuits of the semiconductor device 1120 based on alternating current signals input from the antenna 1118. The data demodulation or modulation circuit 1113 has a function of demodulating or modulating data communicated with a reader/writer 1119. The controller circuit 1114 has a function of controlling the memory circuit 1116. The antenna 1118 has a function of transmitting and receiving electric waves. The reader/writer 1119 communicates with and controls the semiconductor device and controls the processing of data thereof. It is to be noted that the semiconductor device is not limited to having the above structure; for example, the structure may be one that includes additional elements such as a power supply voltage limiter circuit or hardware used exclusively for cryptography processing.

The memory circuit 1116 has a memory element in which an organic compound layer or a phase-change layer is interposed between a pair of conductive layers. It is to be noted that the memory circuit 1116 may have only a memory element in which an organic compound layer or a phase-change layer is interposed between a pair of conductive layers, or the memory circuit 1116 may have a memory circuit that has another structure. A memory circuit with another structure corresponds to one or more selected from a DRAM circuit, an SRAM circuit, an FeRAM circuit, a mask ROM circuit, a PROM circuit, an EPROM circuit, an EEPROM circuit, or a flash memory circuit.

The sensor 1121 is formed using a semiconductor element such as a resistor, a capacitive-coupling element, an inductive-coupling element, a photovoltaic element, a photoelectric conversion element, a thermoelectromotive element, a transistor, a thermistor, a diode, or the like. The sensor circuit 1122 detects changes in impedance, reactance, inductance, voltage, or current; converts signals from analog to digital (A/D conversion); and outputs the converted signals to the controller circuit 1114.

Furthermore, the present embodiment mode can be freely combined with Embodiment Mode 1 or Embodiment Mode 2. For example, the element substrate which has an integrated circuit formed using the TFT obtained by Embodiment Mode 1 or Embodiment Mode 2 and on which the separation has been performed (flexible substrate) and the flexible substrate provided with the antenna, which is obtained by this embodiment mode, can be attached to each other, so that the both substrates are electrically connected to each other.

By the present invention, a semiconductor device that functions as a chip that has a processor circuit (hereinafter also referred to as a processor chip, a wireless chip, a wireless processor, a wireless memory, and a wireless tag) can be formed. The application of a semiconductor device obtained by the separation method of the present invention covers a wide range; for example, the semiconductor device can be provided and used in paper money, coins, securities, certificates, unregistered bonds, packaging containers, books, storage media, personal belongings, vehicles, food products, clothing, healthcare products, livingware, medicines, electronic appliances, and the like.

Figure 13A:
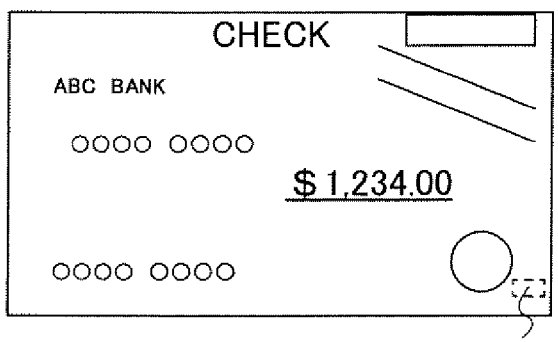
FIGS. 13A to 13G each show an example of a semiconductor device.
Figure 13B:
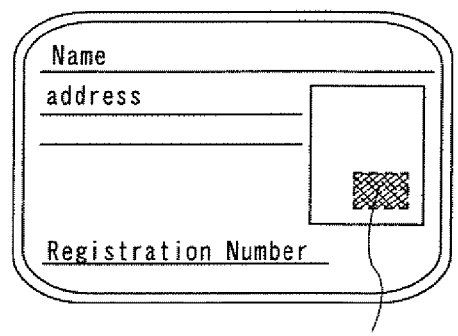
Figure 13C:
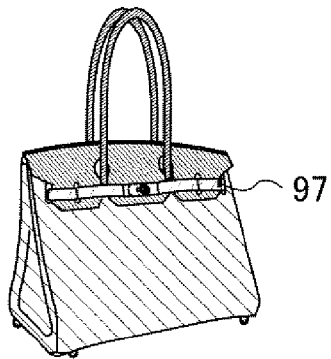
Figure 13D:
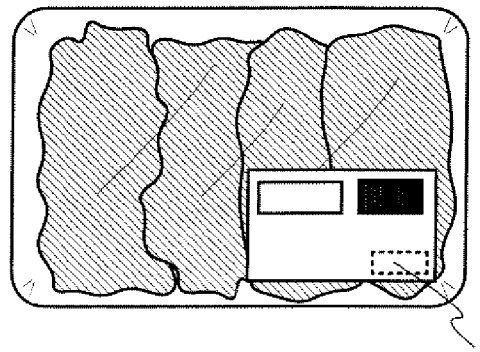
Figure 13E:
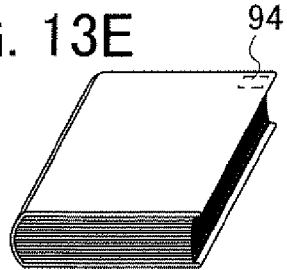
Figure 13F:
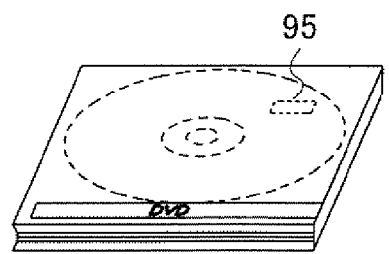
Figure 13G:
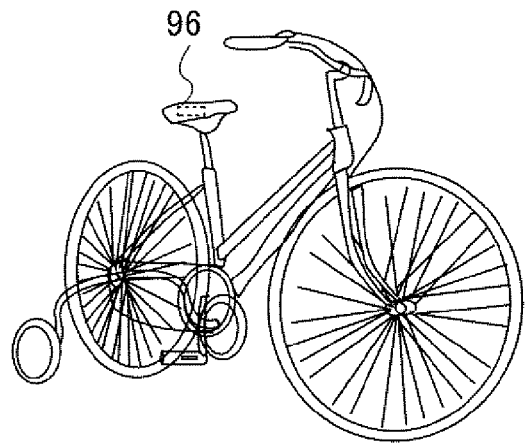

Paper money and coins are money that circulates in the market and include what are used in the same way as currency within a limited region (cash vouchers), memorial coins, and the like. Securities refer to checks, bonds, promissory notes, and the like, and a chip 90 that has a processor circuit can be provided therein (see FIG. 13A). Certificates refer to driver's licenses, residence certificates, and the like, and a chip 91 that has a processor circuit can be provided therein (see FIG. 13B). Personal belongings refer to bags, glasses, and the like, and a chip 97 that has a processor circuit can be provided therein (see FIG. 13C). Unregistered bonds refer to stamps, rice coupons, various kinds of gift vouchers, and the like. Packaging containers refer to wrapping paper for box lunch and the like, plastic bottles, and the like, and a chip 93 that has a processor circuit can be provided therein (see FIG. 13D). Books refer to printed books and the like, and a chip 94 that has a processor circuit can be provided therein (see FIG. 13E). Storage media refer to DVDs, video tapes, and the like, and a chip 95 that has a processor circuit can be provided therein (see FIG. 13F). Vehicles refer to wheeled vehicles such as bicycles, ships, and the like, and a chip 96 that has a processor circuit can be provided therein (see FIG. 13G). Food products refer to foods, beverages, and the like. Clothing refers to garments, footwear, and the like. Healthcare products refer to medical equipment, healthcare equipment, and the like, Livingware refers to furniture, lighting equipment, and the like. Medicines refer to pharmaceutical products, agrochemicals, and the like. Electronic appliances refer to liquid crystal display devices, EL display devices, television devices (television image receiver, flat-screen television image receiver), cellular phones, and the like.

A semiconductor device obtained by the separation method of the present invention is fixed to an article by being mounted to a printed circuit board, by being attached to a surface of the article, or by being embedded in the article. For example, as for a book, the semiconductor device is embedded in the paper; as for packaging made of an organic resin, the semiconductor device is embedded in the organic resin; thus, the semiconductor device is fixed to each article. The semiconductor device of the present invention can achieve reduction in size, thickness, and weight; therefore, even after the semiconductor device is fixed to an article, the design quality of the article itself is not degraded. In addition, by provision of the semiconductor device obtained by the present invention in paper money, coins, securities, unregistered bonds, certificates, and the like, an authentication function can be provided; if this authentication function is utilized, forgery can be prevented. Furthermore, by provision of the semiconductor device obtained by the present invention in packaging containers, storage media, personal belongings, food products, clothing, livingware, electronic appliances, and the like, improvement in the efficiency of systems such as inspection systems can be realized.

Figure 12B:
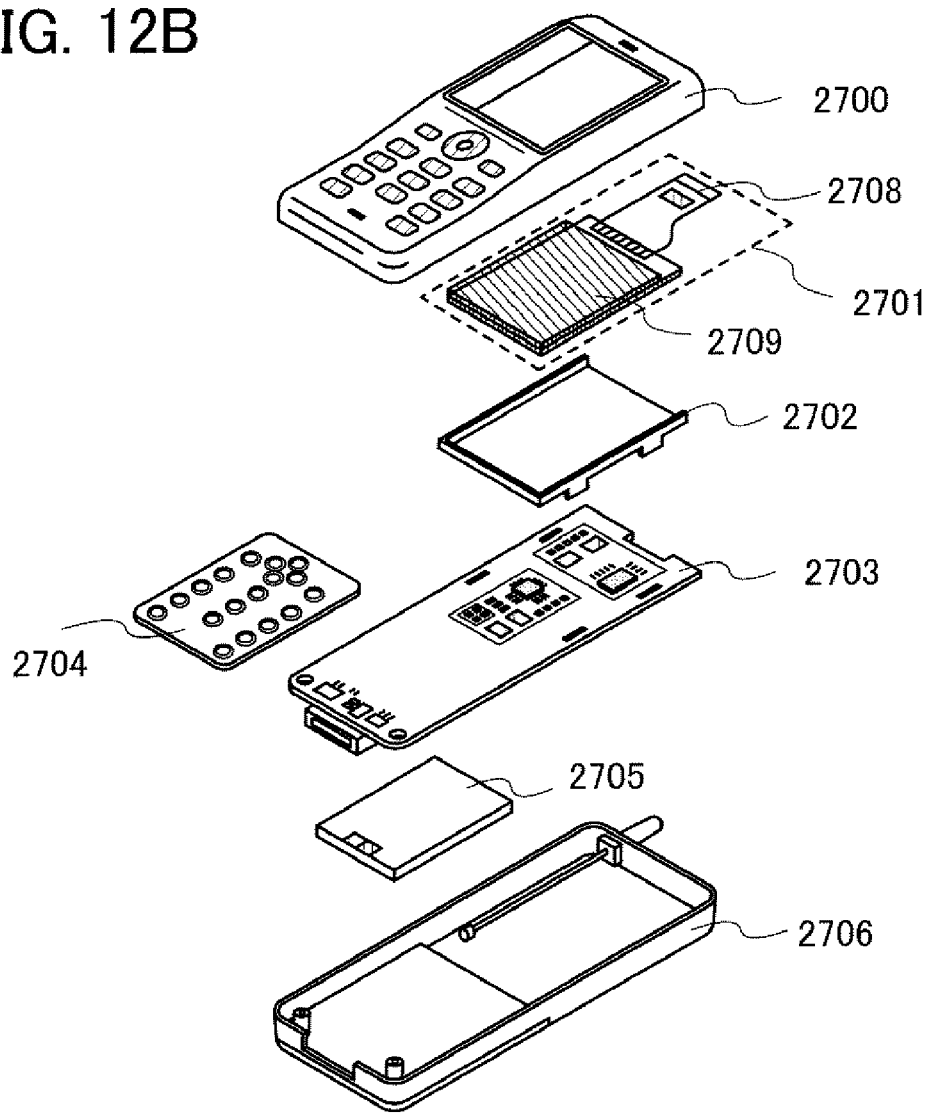
FIG. 12B shows an example of an electronic appliance.

Next, one mode of an electronic appliance in which a semiconductor device obtained by the separation method of the present invention is provided will be explained with reference to drawings. An example of an electronic appliance illustrated here is of a cellular phone, which includes cases 2700 and 2706, a panel 2701, a housing 2702, a printed circuit board 2703, operation buttons 2704, and a battery 2705 (see FIG. 12B). The panel 2701 is detachably incorporated in the housing 2702, and the housing 2702 is fitted to the printed circuit board 2703. The shape and dimensions of the housing 2702 are changed as appropriate to conform to the shape and dimensions of the electronic appliance in which the panel 2701 is incorporated. A plurality of packaged semiconductor devices is mounted on the printed circuit board 2703, and as one out of the plurality of semiconductor devices, a semiconductor device that is obtained by the present invention can be used. The plurality of semiconductor devices mounted on the printed circuit board 2703 functions as any of the following: a controller, a central processing unit (CPU), memory, a power supply circuit, an audio processing circuit, a transmitter-receiver circuit, or the like.

The panel 2701 is connected to the printed circuit board 2703 through a connection film 2708. The panel 2701, the housing 2702, and the printed circuit board 2703 are placed inside the cases 2700 and 2706 together with the operation buttons 2704 and the battery 2705. A pixel region 2709 included in the panel 2701 is positioned in such a way that it is visible through an open window provided in the case 2700.

As described above, because a flexible substrate is used, the semiconductor device obtained by the separation method of the present invention has the characteristics of being thin and lightweight; by the aforementioned characteristics, limited space inside the cases 2700 and 2706 of the electronic appliance can be used effectively.

Since the semiconductor device has a memory element with a simple structure in which an organic compound layer is sandwiched between a pair of conductive layers, an electronic appliance using an inexpensive semiconductor device can be provided.

It is to be noted that the cases 2700 and 2706 are shown as an example of the shape of the appearance of a cellular phone, and electronic appliances of the present embodiment mode can be changed into various modes depending on the functions and intended use.

This embodiment mode can be freely combined with the other Embodiment Modes.

The present invention including the aforementioned structure will be described in more detail in embodiments hereinafter shown.

Embodiment 1

A liquid crystal display device or a light-emitting device obtained by the present invention can be employed in various modules (such as an active matrix liquid crystal module, an active matrix EL module, or an active matrix EC module). That is to say, the present invention can be implemented in all the electronic appliances having these incorporated in display portions.

As those kinds of electronic appliances, cameras such as video cameras and digital cameras, head mount displays (goggle-type displays), car navigation systems, projectors, car stereos, personal computers, portable information terminals (mobile computers, cellular phones, electronic book readers, and the like), and the like can be given. Examples of these appliances are shown in FIGS. 14A to 14C.

Figure 14A:
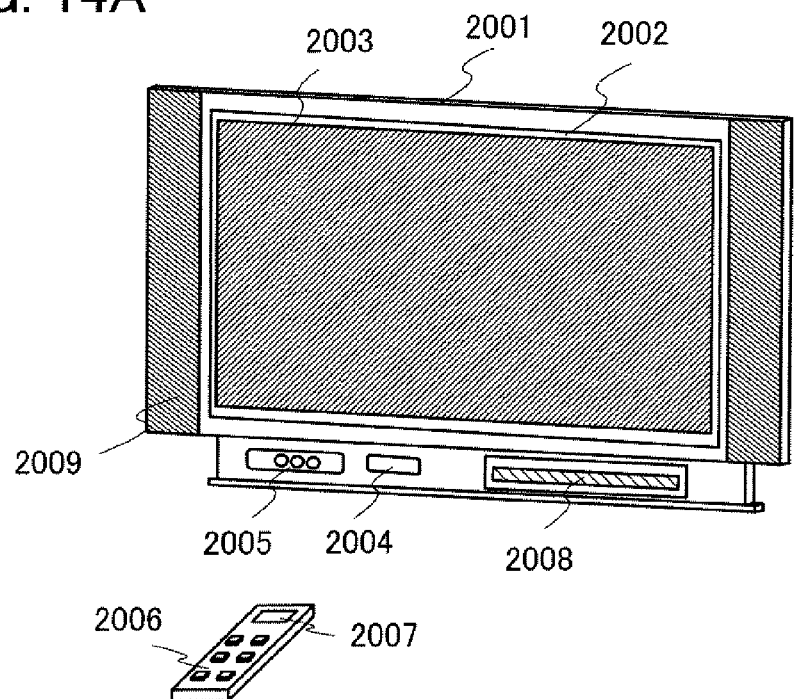
FIGS. 14A to 14C each show an example of an electronic appliance.
Figure 14B:
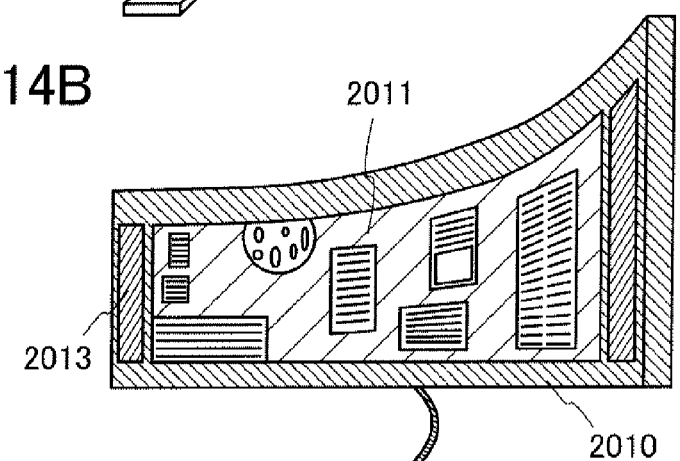
Figure 14C:
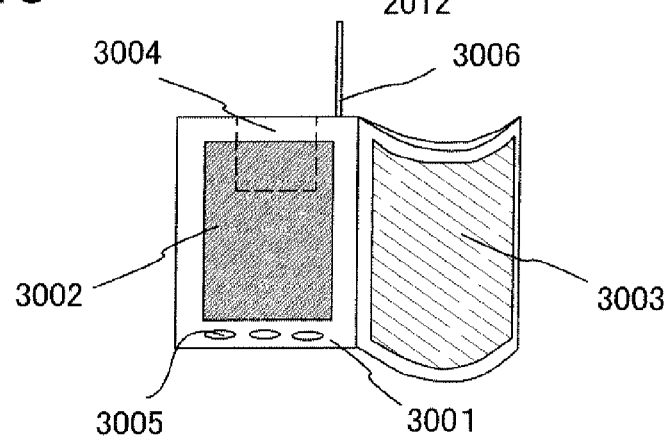
Figure 15:
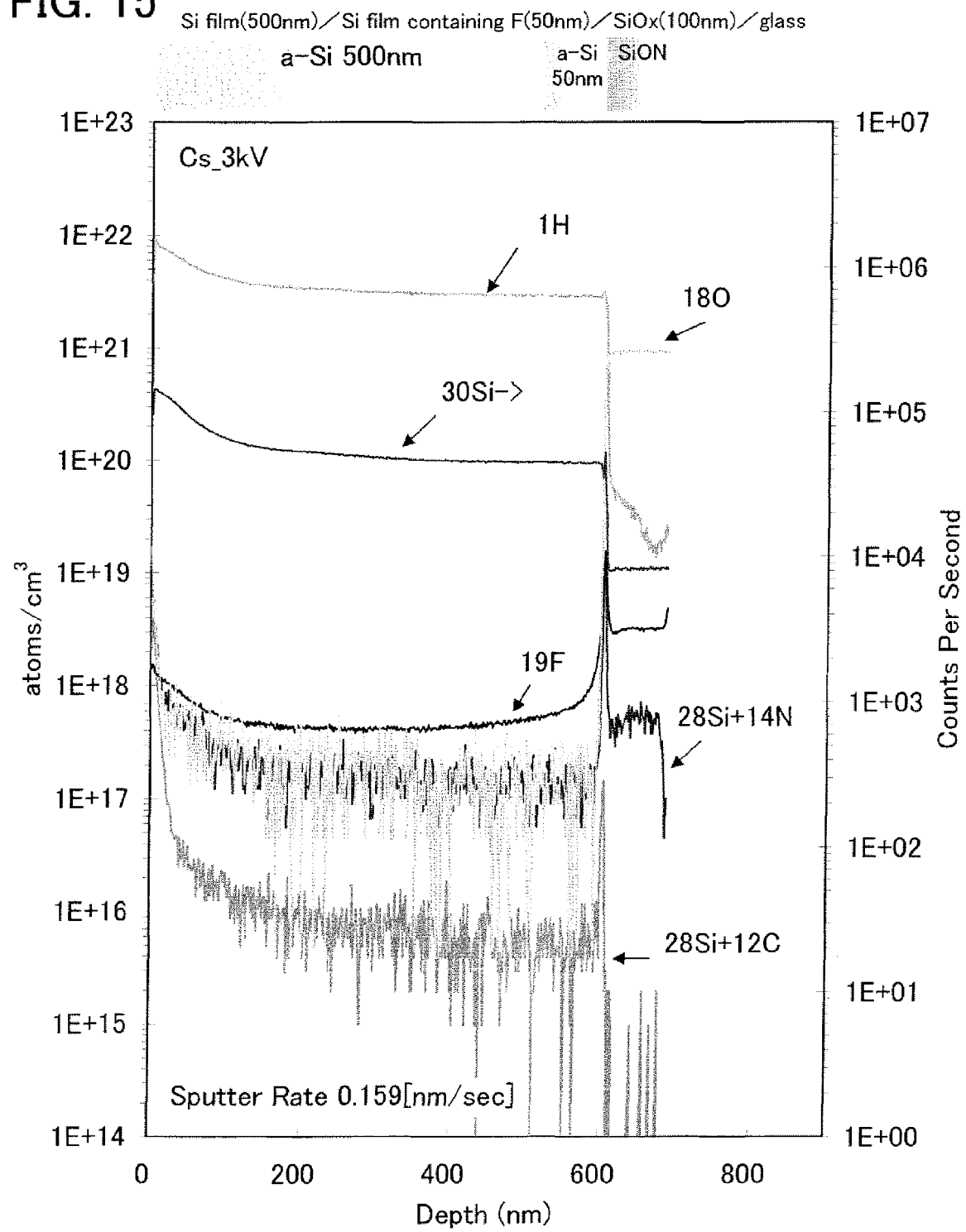
FIG. 15 shows SIMS measurement results before separation.
Figure 16:
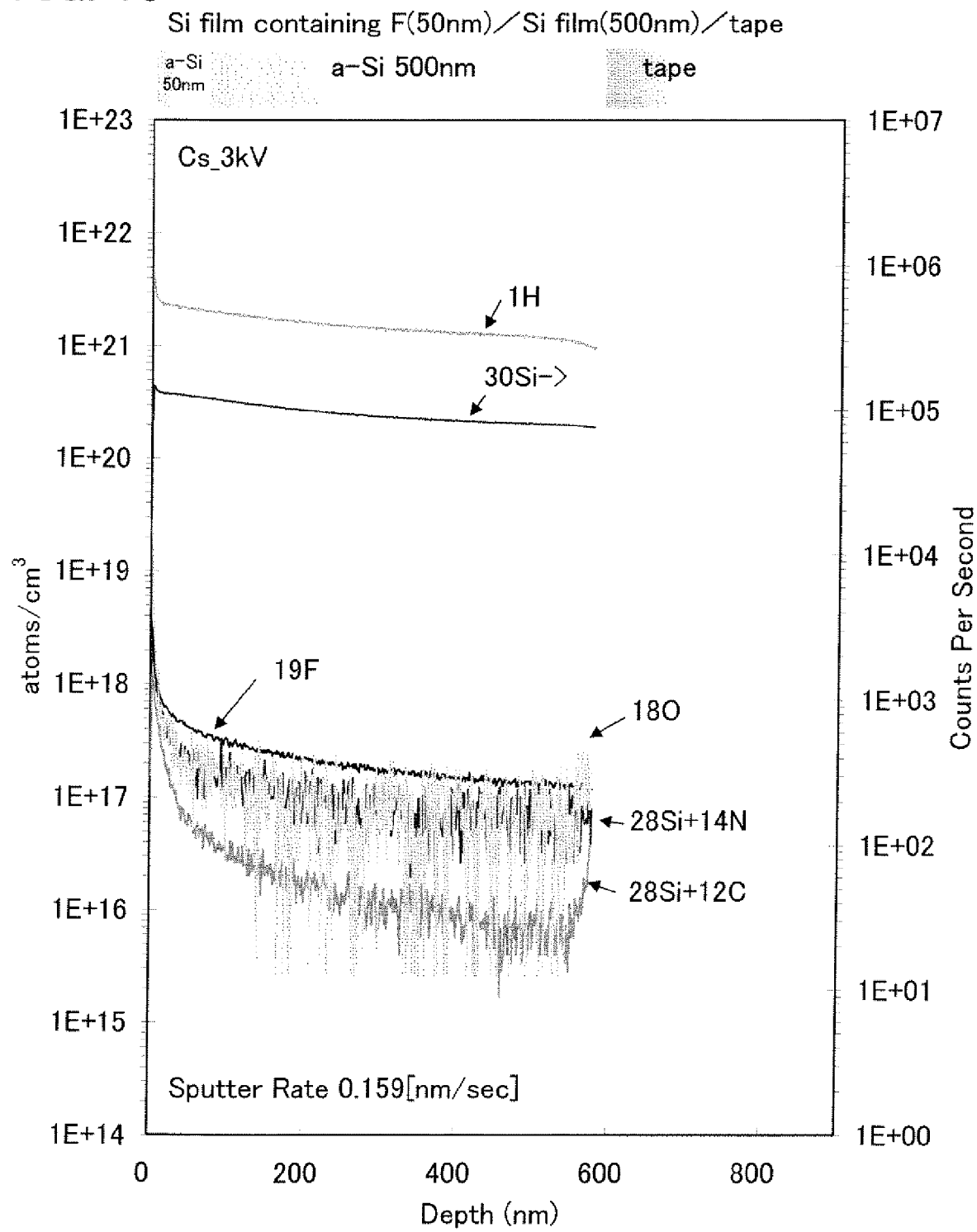
FIG. 16 shows SIMS measurement results after separation.
Figure 17A:
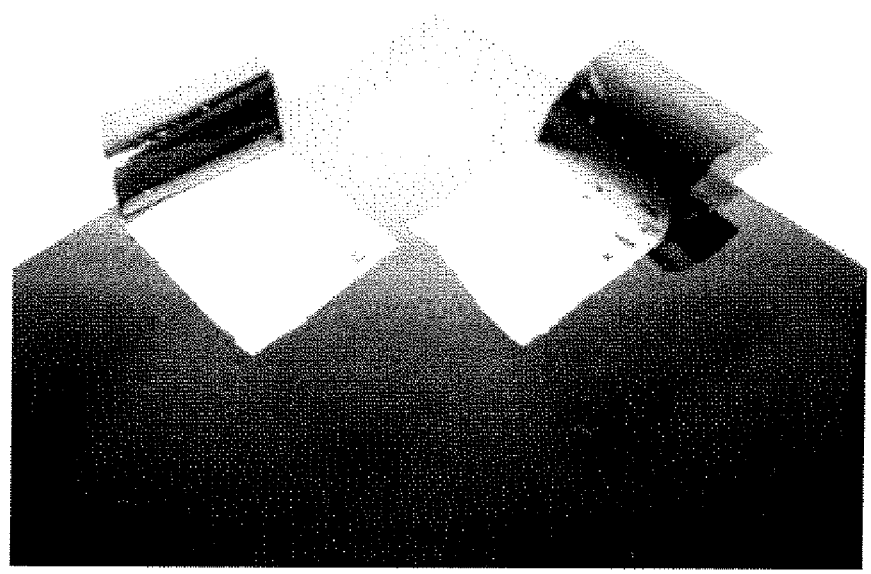
FIG. 17A is a photograph of a thin film after tape separation.
Figure 17B:
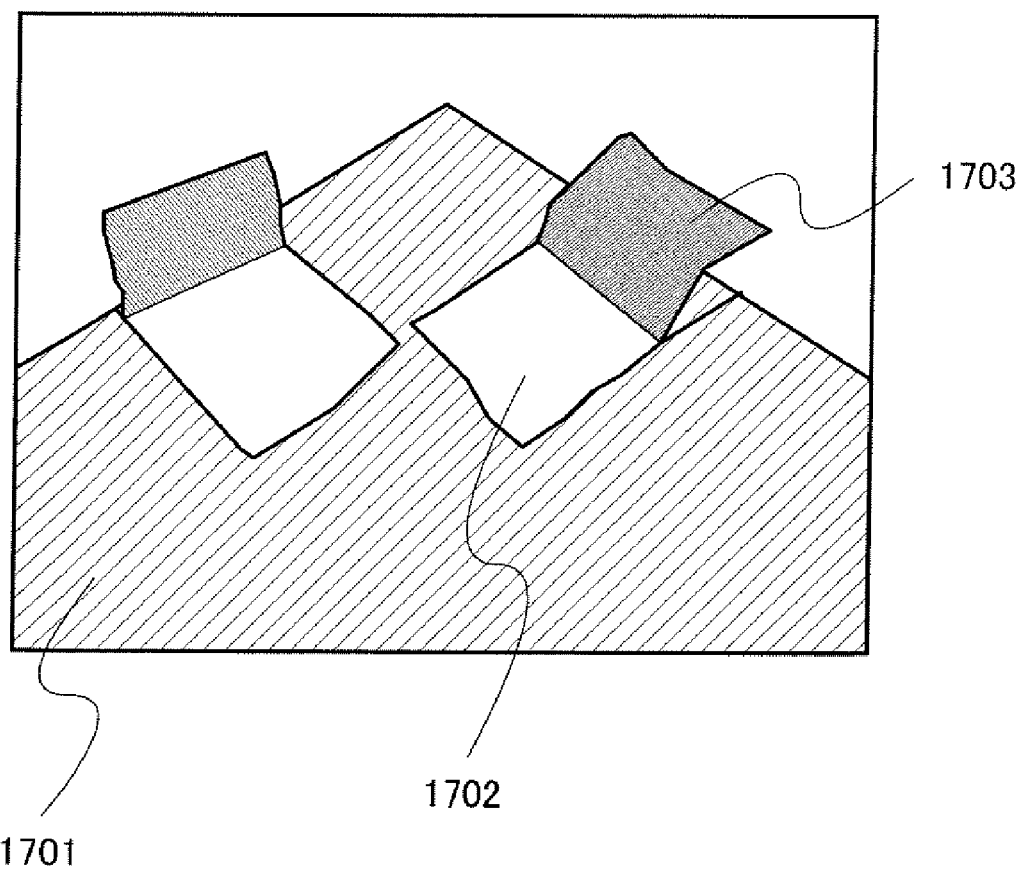
FIG. 17B is a pattern diagram thereof.

FIGS. 14A and 14B each show a television device. As for display panels, there are a case in which only a pixel portion is formed in the display panel and a scanning line side driver circuit and a signal line side driver circuit are mounted to the display panel by a TAB method; a case in which only a pixel portion is formed in the display panel and a scanning line side driver circuit and a signal line side driver circuit are mounted to the display panel by a COG method; a case in which a TFT is formed, a pixel portion and a scanning line side driver circuit are formed over the same substrate, and a signal line side driver circuit is formed separately and mounted to the display panel as a driver IC; a case in which a pixel portion, a signal line side driver circuit, and a scanning line side driver circuit are formed over the same substrate; and the like, but any kind of mode may be used.

For structures of other external circuits, on a video signal input side, there are a video signal amplifier circuit used to amplify video signals out of signals received by a tuner; a video signal processing circuit used to convert signals output from the video signal amplifier circuit into color signals corresponding to each color of red, green, and blue; a control circuit used to convert those video signals in accordance with input specifications for a driver IC; and the like. The control circuit outputs signals to both the scanning line side and the signal line side. When digital driving is performed, a signal divider circuit may be provided on the signal line side so that an input digital signal is divided into a plurality of signals and supplied.

Among signals that are received by a tuner, audio signals are transmitted to an audio signal amplifier circuit, and the output thereof is supplied to a speaker through an audio signal processing circuit. A controller circuit receives information of a receiving station (receiving frequency) and information about control of volume from an input portion, and signals are sent out to the tuner or the audio signal processing circuit.

A television device can be completed by incorporation of a display module into a chassis, as shown in each of FIGS. 14A and 14B. An object including from a display panel to an FPC that is connected to the display panel is also referred to as a display module. A main screen 2003 is formed by the display module, and speaker portions 2009, operation switches, and the like are provided as accessory equipment. As thus described, a television device can be completed.

As shown in FIG. 14A, a display panel 2002 using display elements is incorporated into a chassis 2001. As well as reception of general television broadcast, communication of information in one direction (from a transmitter to a receiver) or in two directions (between a transmitter and a receiver or between receivers) can be carried out with the use of a receiver 2005 by connection to communication network via a modem 2004 with or without wires. Operations of the television device can be carried out using switches that are incorporated into the chassis or by a remote control device 2006 provided separately, and a display portion 2007 that displays output information may be provided in the remote control device, as well.

Furthermore, the television device may have a structure in which a subscreen 2008 used to display channel, volume, and the like is formed using a second display panel, in addition to the main screen 2003. In this structure, the main screen 2003 may be formed using an EL display panel that has an excellent viewing angle, and the subscreen may be formed using a liquid crystal display panel by which display at low power consumption is possible. In addition, in order to give priority to reduction of power consumption, the main screen 2003 may be formed using a liquid crystal display panel and the subscreen may be formed using an EL display panel capable of being turned on or off.

FIG. 14B shows a television device that has a large display portion, for example with a size of from 20 inches to 80 inches, and includes a chassis 2010, a keyboard 2012 used for operations, a display portion 2011, speaker portions 2013, and the like. The present invention is applied to manufacture the display portion 2011. Since the display portion of FIG. 14B uses a flexible substrate that can be curved, the television device has a curved display portion. Because the shape of the display portion can be designed thus freely, a television device that has a desired shape can be manufactured.

By the present invention, display devices can be formed by a simple process, which leads to cost reduction. Consequently, with a television device formed using the present invention, even a television device with a large-screen display portion can be formed at low cost.

Needless to say, the present invention is not limited to being used in television devices, and the present invention can be used in a variety of applications such as monitors for personal computers, and moreover display media that have a large area such as information display boards in railway stations, airports, and the like and advertisement display boards on streets.

In addition, FIG. 14C shows a portable information terminal (electronic book reader) and includes a main body 3001, display portions 3002 and 3003, a storage medium 3004, operation switches 3005, an antenna 3006, and the like. The separation method of the present invention can be applied to the display portions 3002 and 3003. By use of a flexible substrate, the portable information terminal can be made more lightweight. The separation method of the present invention can be used when an antenna is formed over a plane substrate and incorporated instead of the antenna shown in FIG. 14C.

The present embodiment can be freely combined with any one of Embodiment Mode 1 through Embodiment Mode 4.

Embodiment 2

This embodiment will show an example in which an electrophoretic display device is used for the display portion described in Embodiment 1. Typically, the electrophoretic display device is applied to the display portion 3002 or the display portion 3003 of the portable book reader (electronic book reader) that is shown in FIG. 14C.

The electrophoretic display device (electrophoretic display) is also referred to as electronic paper and has advantages in that it has the same level of readability as plain paper, it has less power consumption than other display devices, and it can be made thin and lightweight.

Electrophoretic displays can have various modes. Electrophoretic displays contain a plurality of microcapsules dispersed in a solvent or a solute, each microcapsule containing first particles having positive charge and second particles having negative charge. By applying an electric field to the microcapsules, the particles in the microcapsules are moved in opposite directions to each other and only the color of the particles concentrated on one side is exhibited. It is to be noted that the first particles and the second particles each contain pigment and do not move without an electric field. Moreover, the colors of the first particles and the second particles are set to be different from each other (this includes particles that are colorless).

In this way, an electrophoretic display is a display that utilizes a so-called dielectrophoretic effect by which a substance that has a high dielectric constant move to a region in which there is a high electric field. An electrophoretic display does not need to use a polarizer and a counter substrate, which are required in a liquid crystal display device, and both the thickness and weight of the electrophoretic display device can be a half of those of a liquid crystal display device.

A solution in which the aforementioned microcapsules are dispersed throughout a solvent is referred to as electronic ink. This electronic ink can be printed on a surface of glass, plastic, cloth, paper, or the like. Furthermore, by use of a color filter or particles that have a pigment, color display is possible, as well.

In addition, if a plurality of the aforementioned microcapsules is arranged as appropriate over a substrate so as to be interposed between a pair of electrodes, a display device can be completed, and display can be performed by application of an electric field to the microcapsules. For example, the active matrix substrate obtained by Embodiment Mode 1 can be used. Although electronic ink can be printed directly on a plastic substrate, when the display device is of active matrix type, it is preferable that elements and electronic ink be formed over a glass substrate and then separated from the glass substrate and attached to a plastic substrate as a flexible substrate according to the separation method of Embodiment Mode 1 or Embodiment Mode 2, rather than that elements are formed over a plastic substrate that is sensitive to heat and organic solvents. This is because the device can be manufactured under a wide range of conditions in a process.

It is to be noted that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, or a magnetophoretic material or formed of a composite material of any of these.

The present embodiment mode can be freely combined with any one of Embodiment Modes 1 through 4 and Embodiment 1.

According to the present invention, after elements such as TFTs are formed by using an existing manufacturing equipment for large-area glass substrates, the elements can be transferred to a flexible substrate. Therefore, facility cost can be drastically reduced.

This application is based on Japanese Patent Application serial no. 2007-144360 filed with Japan Patent Office on May 31, 2007, the entire contents of which are hereby incorporated by reference.

What is claimed is:

1. A method of manufacturing a semiconductor device, comprising:
    forming a semiconductor layer containing a halogen element over a substrate having an insulating surface;
    forming a buffer layer over the semiconductor layer;
    forming at least one of a semiconductor element and a light-emitting element over the buffer layer; and
    separating the buffer layer and the at least one of the semiconductor element and the light-emitting element from the substrate.

2. The method of manufacturing a semiconductor device, according to claim 1,
    wherein the halogen element is fluorine or chlorine.

3. The method of manufacturing a semiconductor device, according to claim 1, wherein the semiconductor layer is an amorphous silicon film formed by a plasma CVD method.

4. The method of manufacturing a semiconductor device, according to claim 1,
wherein the buffer layer is an insulating layer formed by a plasma CVD method.

5. The method of manufacturing a semiconductor device, according to claim 1,
wherein concentration of the halogen element contained in the semiconductor layer is equal to or higher than $1 \times 10^{17}$ cm$^{-3}$ equal to or lower than $2 \times 10^{2}$ cm$^{-3}$.

6. The method of manufacturing a semiconductor device, according to claim 1,
wherein the substrate having an insulating surface is a glass substrate.

7. A method of manufacturing a semiconductor device, comprising:
forming a semiconductor layer containing a halogen element over a substrate having an insulating surface;
forming a buffer layer over the semiconductor layer;
forming at least one of a semiconductor element and a light-emitting element over the buffer layer; and
performing detachment at an interface between the substrate and the semiconductor layer.

8. The method of manufacturing a semiconductor device, according to claim 7,
wherein the halogen element is fluorine or chlorine.

9. The method of manufacturing a semiconductor device, according to claim 7,
wherein the semiconductor layer is an amorphous silicon film formed by a plasma CVD method.

10. The method of manufacturing a semiconductor device, according to claim 7,
wherein the buffer layer is an insulating layer formed by a plasma CVD method.

11. The method of manufacturing a semiconductor device, according to claim 7,
wherein concentration of the halogen element in the semiconductor layer near the interface between the semiconductor layer and the substrate is higher than concentration of the halogen element in the semiconductor layer near the interface between the semiconductor layer and the buffer layer.

12. The method of manufacturing a semiconductor device, according to claim 7,
wherein concentration of the halogen element contained in the semiconductor layer is equal to or higher than $1 \times 10^{17}$ cm$^{-3}$ equal to or lower than $2 \times 10^{20}$ cm$^{-3}$.

13. The method of manufacturing a semiconductor device, according to claim 7,
wherein the substrate having an insulating surface is a glass substrate.

14. A method of manufacturing a semiconductor device, comprising:
forming a semiconductor layer containing a halogen element over a substrate having an insulating surface;
forming a buffer layer over the semiconductor layer;
forming at least one of a semiconductor element and a light-emitting element over the buffer layer; and
performing detachment at an interface between the semiconductor layer and the buffer layer.

15. The method of manufacturing a semiconductor device, according to claim 14,
wherein the halogen element is fluorine or chlorine.

16. The method of manufacturing a semiconductor device, according to claim 14,
wherein the semiconductor layer is an amorphous silicon film formed by a plasma CVD method.

17. The method of manufacturing a semiconductor device, according to claim 14,
wherein the buffer layer is an insulating layer formed by a plasma CVD method.

18. The method of manufacturing a semiconductor device, according to claim 14
wherein concentration of the halogen element in the semiconductor layer near the interface between the semiconductor layer and the buffer layer is higher than concentration of the halogen element in the semiconductor layer near the interface between the semiconductor layer and the substrate.

19. The method of manufacturing a semiconductor device, according to claim 14,
wherein concentration of the halogen element contained in the semiconductor layer is equal to or higher than $1 \times 10^{17}$ cm$^{-3}$ equal to or lower than $2 \times 10^{20}$ cm$^{-3}$.

20. The method of manufacturing a semiconductor device, according to claim 14,
wherein the substrate having an insulating surface is a glass substrate.

21. A method of manufacturing a semiconductor device, comprising:
forming a semiconductor layer containing a halogen element over a substrate having an insulating surface;
forming a buffer layer over the semiconductor layer;
forming at least one of a semiconductor element and a light-emitting element over the buffer layer; and
performing detachment inside the semiconductor layer.

22. The method of manufacturing a semiconductor device, according to claim 21,
wherein the halogen element is fluorine or chlorine.

23. The method of manufacturing a semiconductor device, according to claim 21,
wherein the semiconductor layer is an amorphous silicon film formed by a plasma CVD method.

24. The method of manufacturing a semiconductor device, according to claim 21,
wherein the buffer layer is an insulating layer formed by a plasma CVD method.

25. The method of manufacturing a semiconductor device, according to claim 21,
wherein concentration of the halogen element contained in the semiconductor layer is equal to or higher than $1 \times 10^{17}$ cm$^{-3}$ equal to or lower than $2 \times 10^{20}$ cm$^{3}$.

26. The method of manufacturing a semiconductor device, according to claim 21,
wherein the substrate having an insulating surface is a glass substrate.

* * * * *